(12) United States Patent
Righetti et al.

(10) Patent No.: US 9,214,389 B2
(45) Date of Patent: Dec. 15, 2015

(54) METHODS OF FORMING MEMORY ARRAYS

(71) Applicant: Micron Technology, Inc., Boise, ID (US)

(72) Inventors: Niccolo' Righetti, Milan (IT); Sara Vigano, Monza (IT); Emilio Camerlenghi, Bergamo (IT)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 14/265,168

(22) Filed: Apr. 29, 2014

(65) Prior Publication Data

US 2015/0311115 A1 Oct. 29, 2015

(51) Int. Cl.
*H01L 21/76* (2006.01)
*H01L 21/768* (2006.01)

(52) U.S. Cl.
CPC .... *H01L 21/76877* (2013.01); *H01L 21/76802* (2013.01)

(58) Field of Classification Search
CPC .................. H01L 21/76877; H01L 21/76802
USPC .......................................................... 438/425
See application file for complete search history.

(56) References Cited

U.S. PATENT DOCUMENTS

| | | | |
|---|---|---|---|
| 8,970,040 B1* | 3/2015 | Chen | 257/758 |
| 2009/0180324 A1* | 7/2009 | Ramaswamy et al. | 365/185.17 |
| 2010/0327339 A1* | 12/2010 | Tanaka et al. | 257/324 |
| 2012/0001247 A1* | 1/2012 | Alsmeier | 257/316 |
| 2013/0126957 A1* | 5/2013 | Higashitani et al. | 257/314 |
| 2014/0085959 A1* | 3/2014 | Saraswat et al. | 365/63 |

* cited by examiner

*Primary Examiner* — Asok K Sarkar
*Assistant Examiner* — Igwe U Anya
(74) *Attorney, Agent, or Firm* — Wells St. John P.S.

(57) ABSTRACT

Some embodiments include methods of forming memory arrays. An assembly is formed which has an upper level over a lower level. The lower level includes circuitry. The upper level includes semiconductor material within a memory array region, and includes insulative material in a region peripheral to the memory array region. First and second trenches are formed to extend into the semiconductor material. The first and second trenches pattern the semiconductor material into a plurality of pedestals. The second trenches extend into the peripheral region. Contact openings are formed within the peripheral region to extend from the second trenches to the first level of circuitry. Conductive material is formed within the second trenches and within the contact openings. The conductive material forms sense/access lines within the second trenches and forms electrical contacts within the contact openings to electrically couple the sense/access lines to the lower level of circuitry.

26 Claims, 25 Drawing Sheets

X-X

Y-Y

US 9,214,389 B2

METHODS OF FORMING MEMORY ARRAYS

TECHNICAL FIELD

Methods of forming memory arrays.

BACKGROUND

Integrated circuit fabrication may comprise formation of multiple levels (i.e., tiers) over a semiconductor base. For instance, a level comprising memory may be formed over a lower level comprising decoding circuitry and/or other circuitry utilized during operation of the memory.

Electrical coupling between the levels may present challenges during fabrication.

DETAILED DESCRIPTION OF THE ILLUSTRATED EMBODIMENTS

Some embodiments pertain to new methods of forming electrical interconnects between levels of integrated circuitry. For instance, interconnect openings may be formed at the bottom of sense/access line trenches utilizing a same mask as is utilized for patterning the trenches, in combination with another mask. The utilization of the common mask for both patterning the trenches and patterning the interconnect openings may simplify alignment of the interconnect openings with the sense/access line trenches. In subsequent processing, conductive material may be formed within the sense/access line trenches and the interconnect openings to simultaneously form sense/access lines and interconnects. Example embodiments are described with reference to FIGS. 1-37.

Figure 1:
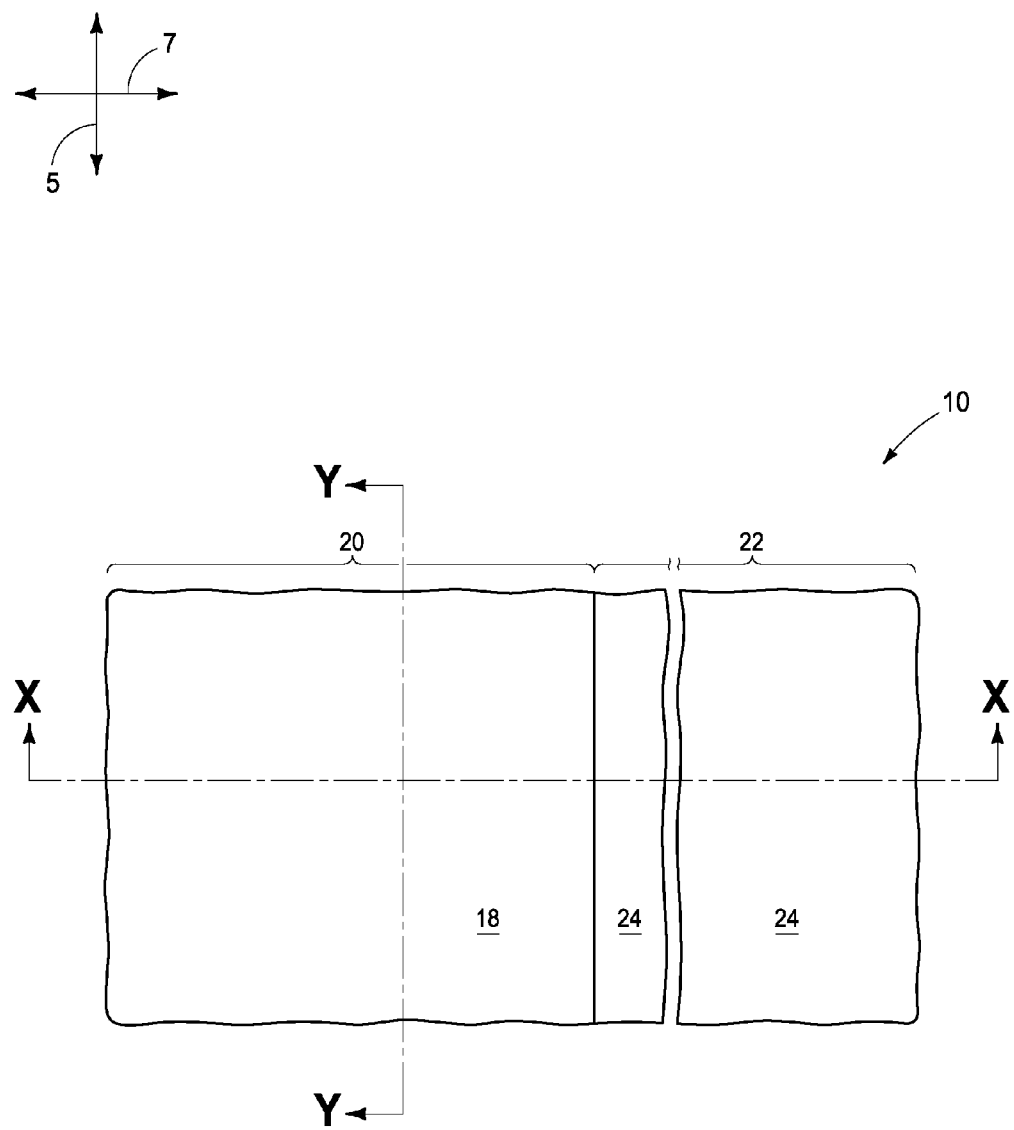
FIGS. 1-3 are a top view and cross-sectional side views of a construction at a processing stage of an example embodiment method. The cross-sectional views of FIGS. 2 and 3 are along the lines X-X and Y-Y, respectively, of FIG. 1.
Figure 2:
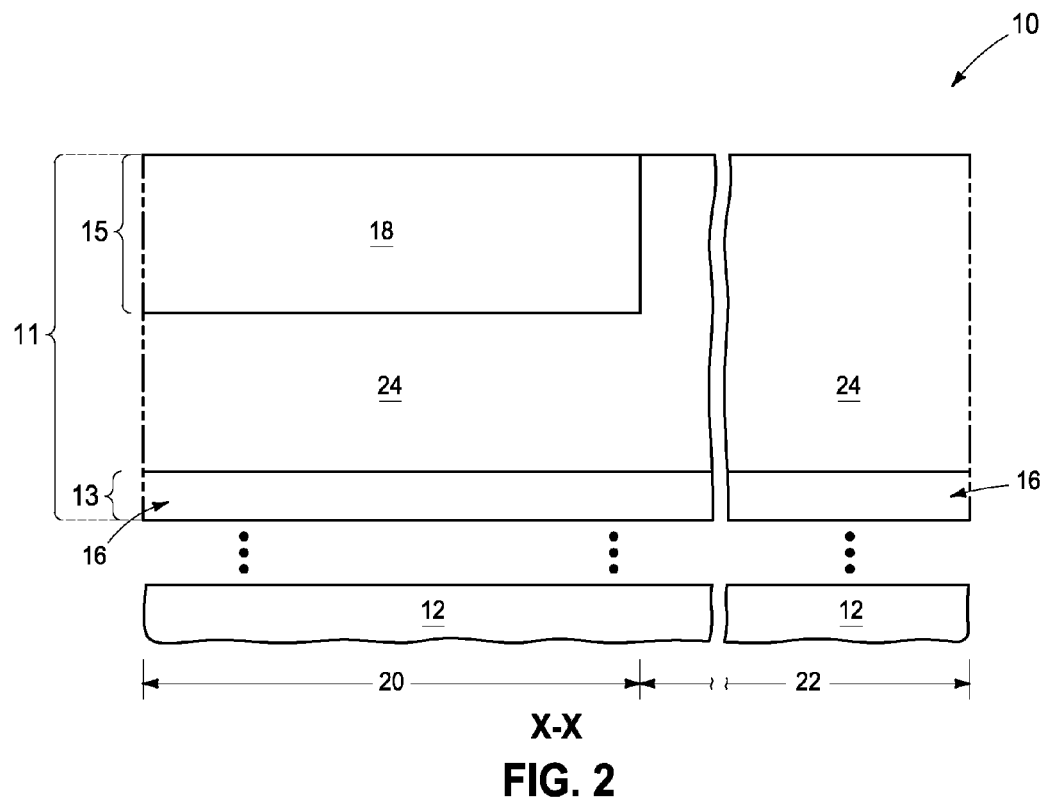
Figure 3:
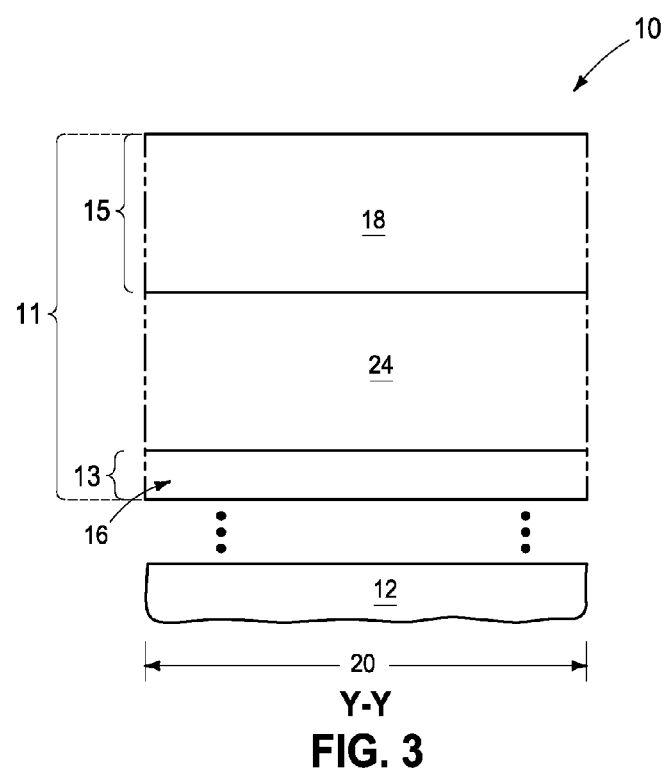

Referring to FIGS. 1-3, an example construction 10 is shown to comprise an assembly 11 supported over a semiconductor base 12.

The base 12 may comprise semiconductor material, and in some embodiments may comprise, consist essentially of, or consist of monocrystalline silicon. In some embodiments, base 12 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 12 may correspond to a semiconductor substrate containing one or more materials associated with integrated circuit fabrication. Some of the materials may be under the shown region of base 12 and/or may be laterally adjacent the shown region of base 12; and may correspond to, for example, one or more of refractory metal materials, barrier materials, diffusion materials, insulator materials, etc.

The base 12 is separated from assembly 11 to indicate that there may be other materials (not shown) between the base and the assembly.

The assembly 11 comprises an upper level 15 over a lower level 13. The lower level comprises circuitry 16 (diagrammatically indicated with a box along the lower level), and the upper level comprises semiconductor material 18. The semiconductor material is within a memory array region 20. A peripheral region 22 is laterally outward of the memory array region.

Electrically insulative material 24 is shown between the lower level 13 and the upper level 15, and is also shown to extend within the peripheral region 22. A break is shown within the peripheral region to indicate that the peripheral region may extend a substantial distance beyond the memory array region.

Although homogeneous insulative material 24 is shown between levels 13 and 15, as well as within peripheral region 22, in other embodiments multiple electrically insulative materials may be utilized. Further, in some embodiments conductive materials may be interspersed within insulative material 24. Such conductive materials may within other levels of integrated circuitry between the levels 13 and 15 and/or may correspond to materials supporting the semiconductor material 18. For instance, in some embodiments material 18 may be part of a silicon-on-metal construction, and accordingly a layer of metal (not shown) may be directly beneath semiconductor material 18.

The circuitry 16 may comprise any suitable circuitry. In some embodiments, a memory array will be formed to comprise semiconductor material 18 of upper level 15, and the circuitry 16 of lower level 13 will be utilized for operation of such memory array. In such embodiments, circuitry 16 may comprise, for example, decoding circuitry (for instance, CMOS decoding circuitry).

The assembly 11 may be formed with any suitable processing; and in some embodiments may be formed utilizing silicon-on-insulator fabrication techniques.

Figure 4:
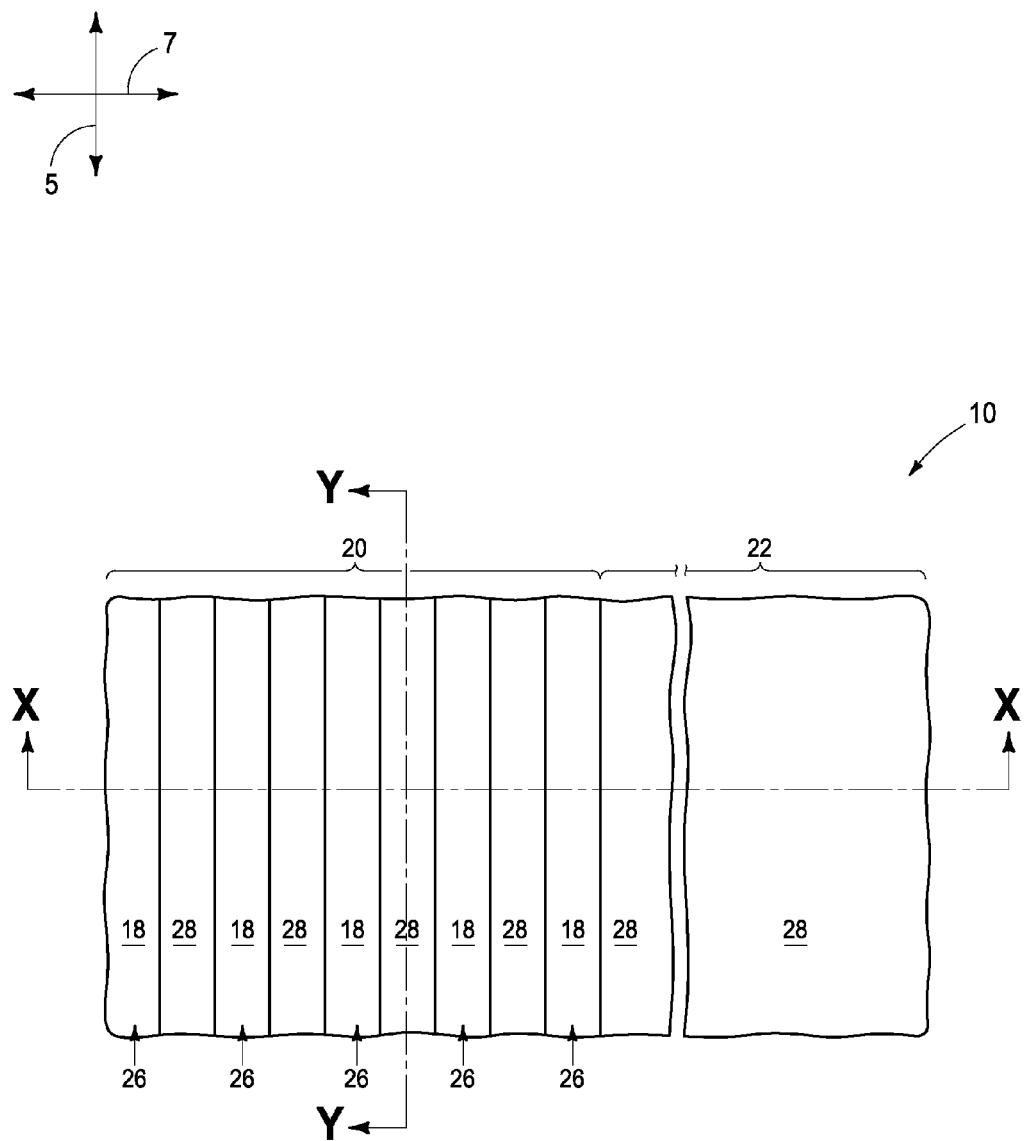
FIGS. 4-6 are a top view and cross-sectional side views of a construction at an example processing stage subsequent to that of FIGS. 1-3. The cross-sectional views of FIGS. 5 and 6 are along the lines X-X and Y-Y, respectively, of FIG. 4.
Figure 5:
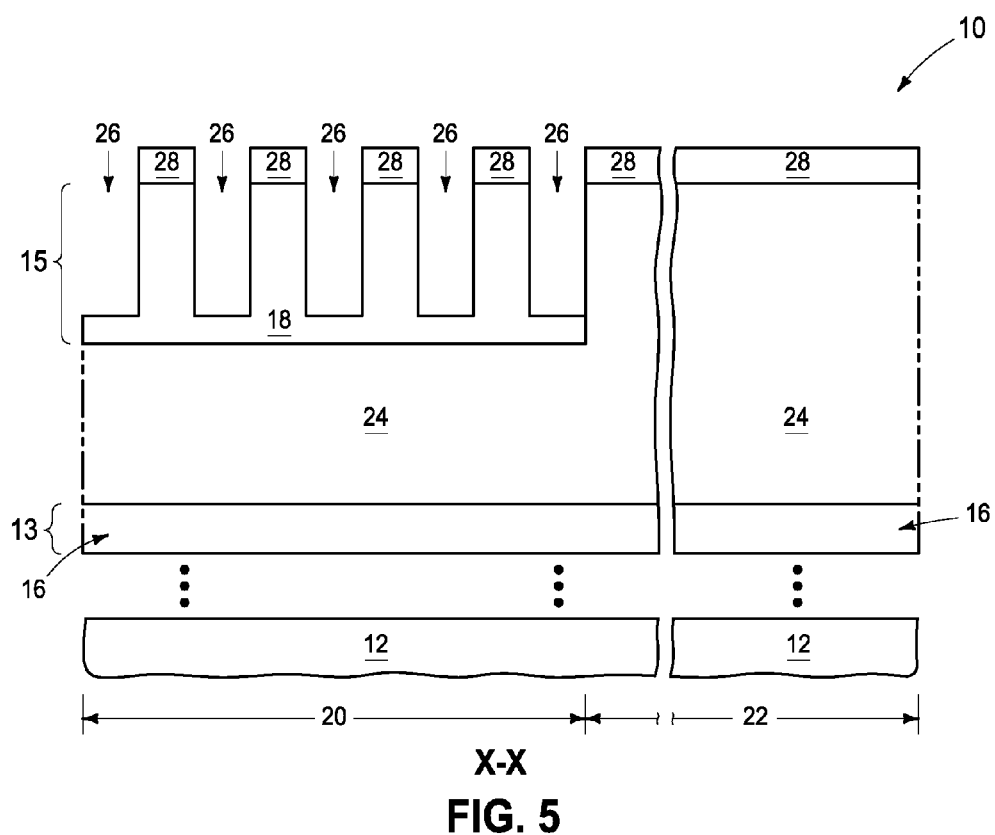
Figure 6:
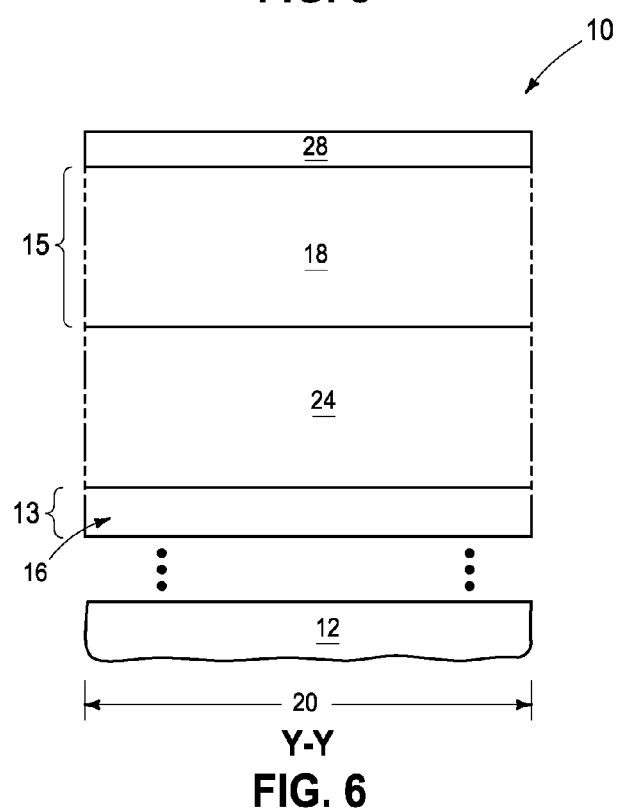

Referring to FIGS. 4-6, a patterned masking material 28 is formed over upper surfaces of semiconductor material 18 and insulative material 24. The masking material 28 defines locations for trenches 26 across memory array region 20, and subsequently such trenches are formed by etching into semiconductor material 18. In the shown embodiment, the trenches 26 extend only partially through material 18. In other embodiments, the trenches may extend entirely through the semiconductor material.

Masking material 28 may comprise any suitable composition or combination of compositions, and in some embodiments may comprise silicon nitride over a pad oxide. The material 28 may be patterned utilizing any suitable processing; including, for example, photolithographic processing and/or pitch-multiplication methodology. Accordingly, trenches 26 may be on a lithographic pitch or a sublithographic pitch. If photolithographic processing is utilized to pattern material 28, photoresist may be at least part of the patterned material.

The trenches 26 extend along a direction of an axis 5. Another axis 7 is shown extending orthogonally relative to the axis 5. In subsequent processing, other trenches are formed along axis 7. In some embodiments, the trenches 26 may be referred to as first trenches to distinguish them from the other trenches.

Figure 7:
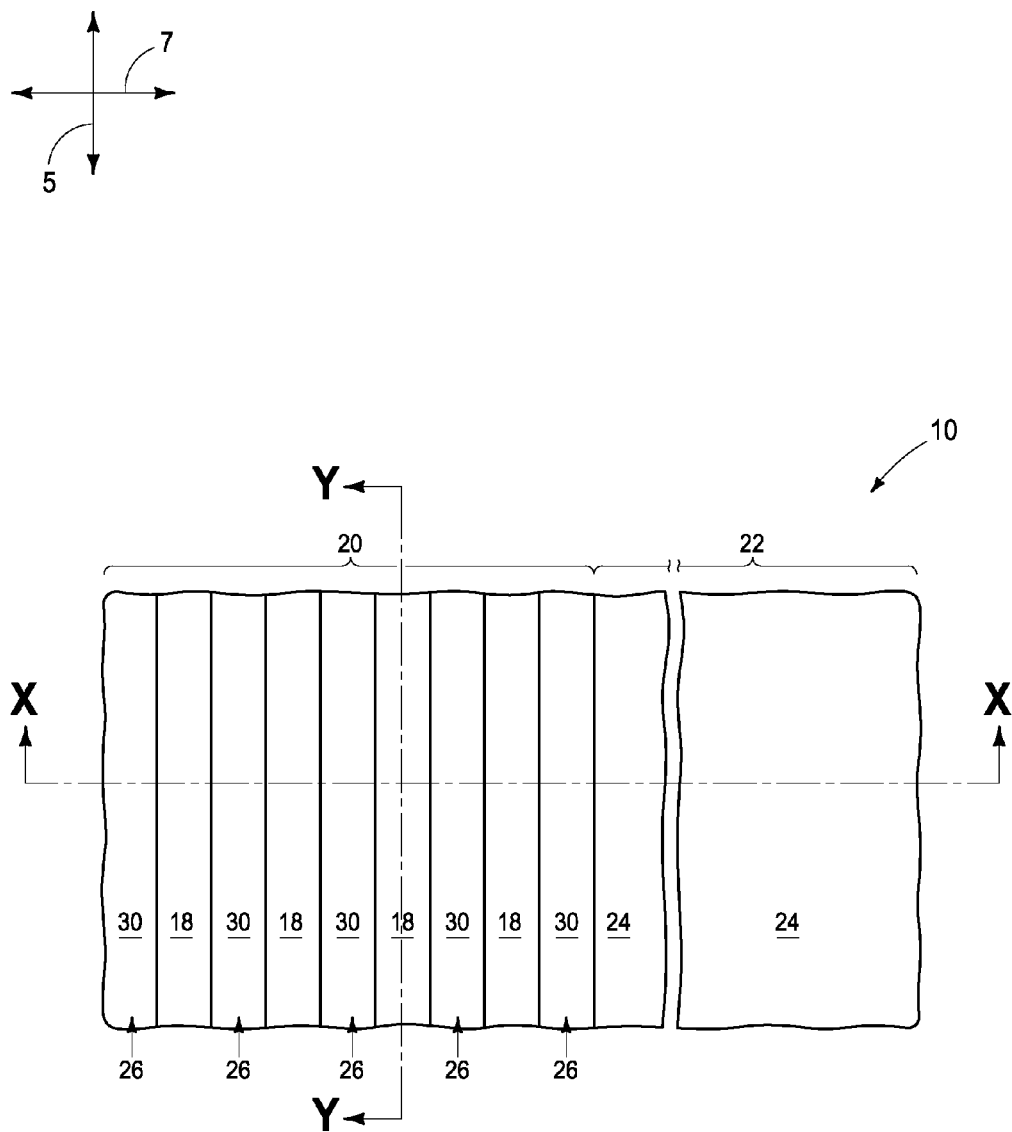
FIGS. 7-9 are a top view and cross-sectional side views of a construction at an example processing stage subsequent to that of FIGS. 4-6. The cross-sectional views of FIGS. 8 and 9 are along the lines X-X and Y-Y, respectively, of FIG. 7.
Figure 8:
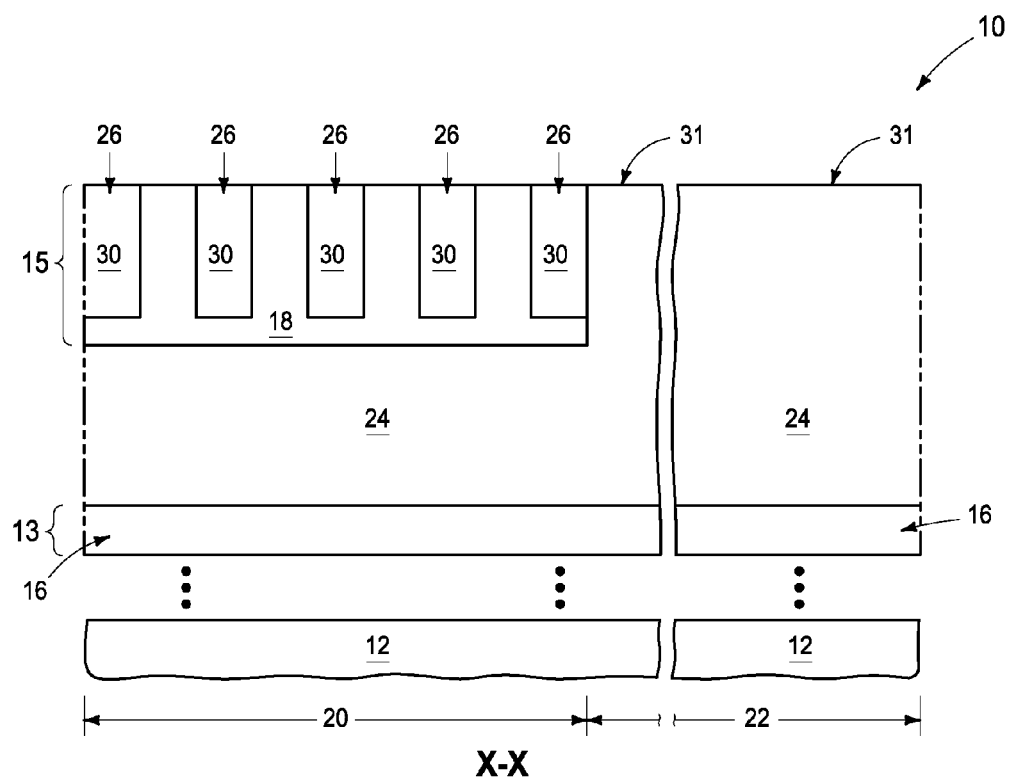
Figure 9:
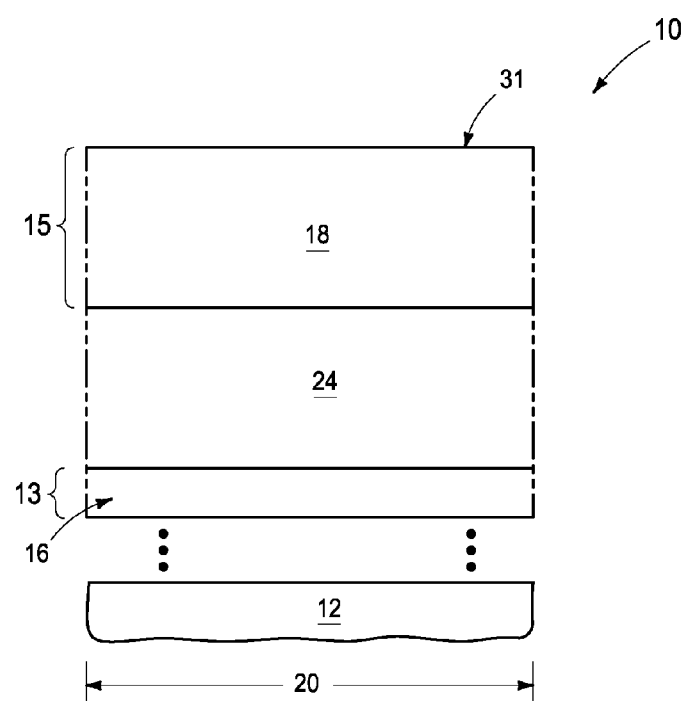

Referring to FIGS. 7-9, insulative material 30 is formed within trenches 26 and subsequently construction 10 is subjected to planarization to form a planarized upper surface 31 extending across materials 18, 24 and 30. The insulative material 30 may comprise any suitable composition or combination of compositions; and in some embodiments may comprise one or both of silicon dioxide and silicon nitride. In some embodiments, material 30 may be a same composition as material 24; and in other embodiments material 30 may be a different composition than material 24.

Figure 10:
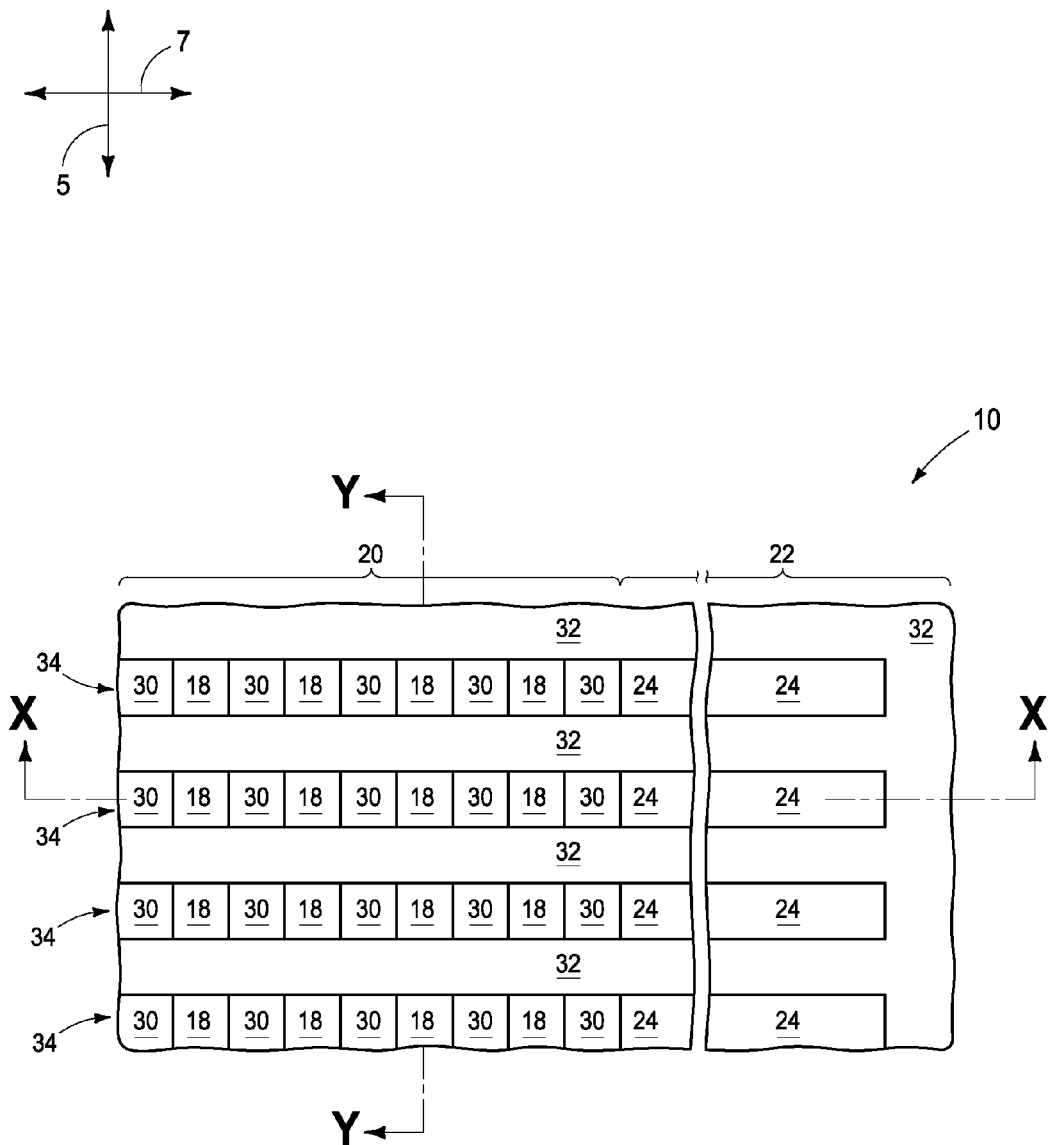
FIGS. 10-12 are a top view and cross-sectional side views of a construction at an example processing stage subsequent to that of FIGS. 7-9. The cross-sectional views of FIGS. 11 and 12 are along the lines X-X and Y-Y, respectively, of FIG. 10.
Figure 11:
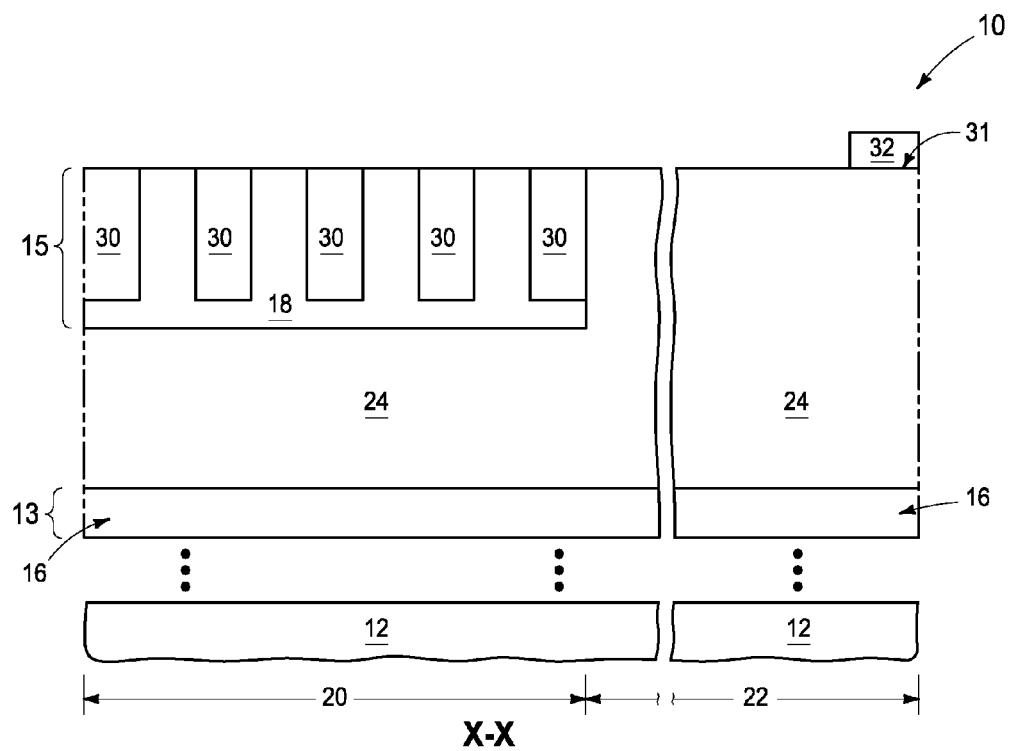
Figure 12:
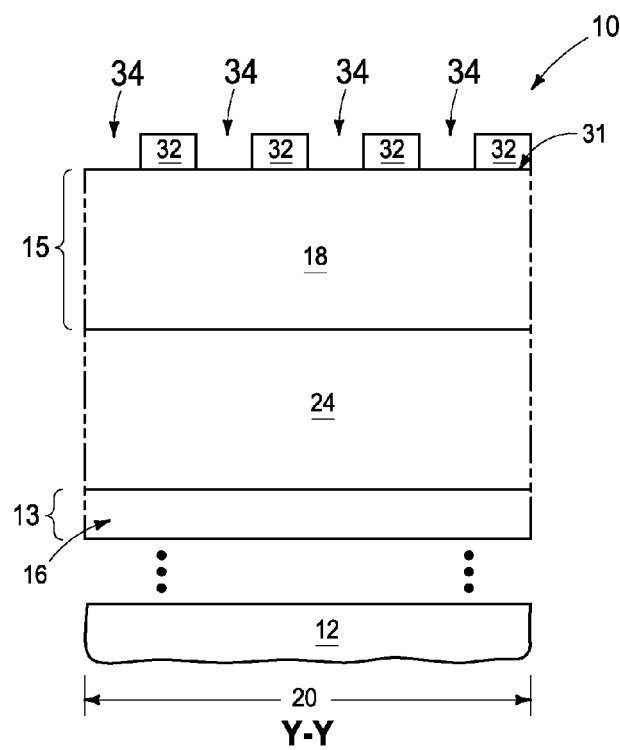

Referring to FIGS. 10-12, patterned masking material 32 is formed over planarized surface 31. The masking material 32 has a plurality of openings extending therethrough, with such openings defining locations of trenches 34.

Masking material 32 may comprise any suitable composition or combination of compositions, and in some embodiments may comprise silicon nitride over a pad oxide. The material 32 may be patterned utilizing any suitable processing; including, for example, photolithographic processing and/or pitch-multiplication methodology. Accordingly, trenches 34 may be on a lithographic pitch or a sublithographic pitch. If photolithographic processing is utilized to pattern material 32, photoresist may be at least part of the patterned material.

Figure 13:
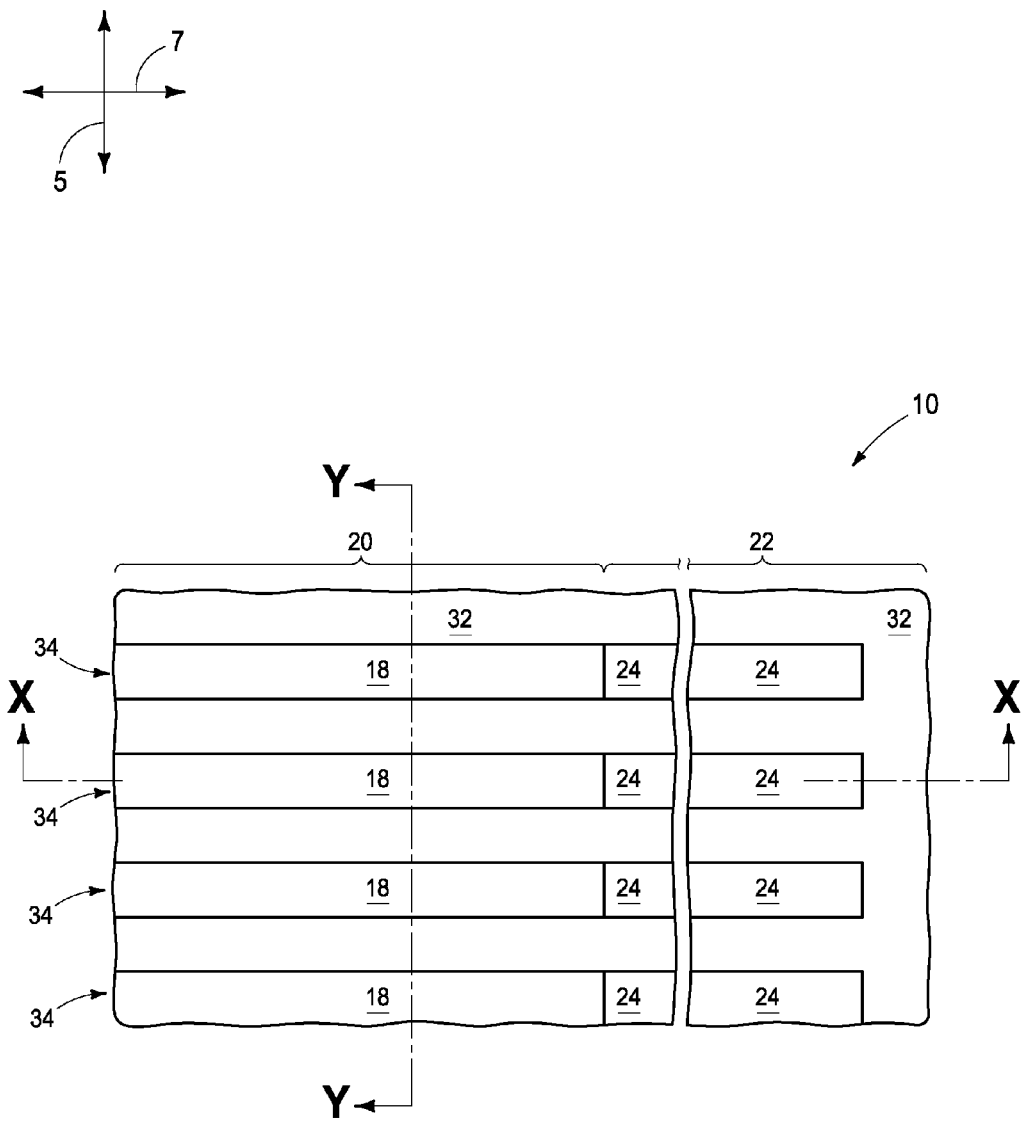
FIGS. 13-15 are a top view and cross-sectional side views of a construction at an example processing stage subsequent to that of FIGS. 10-12. The cross-sectional views of FIGS. 14 and 15 are along the lines X-X and Y-Y, respectively, of FIG. 13.
Figure 14:
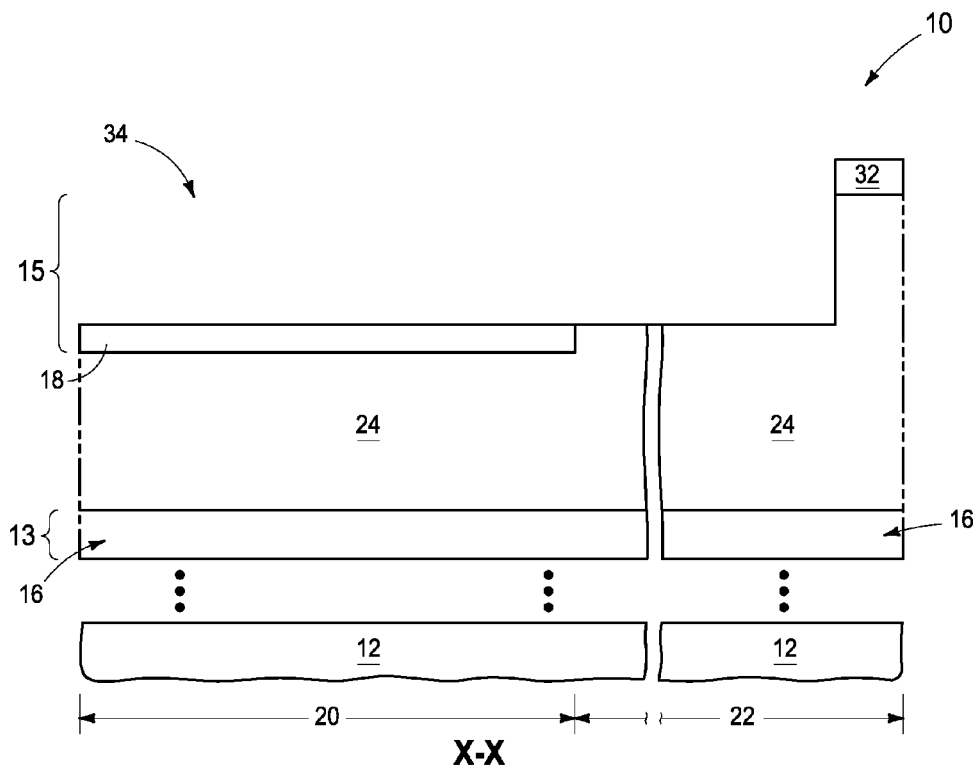
Figure 15:
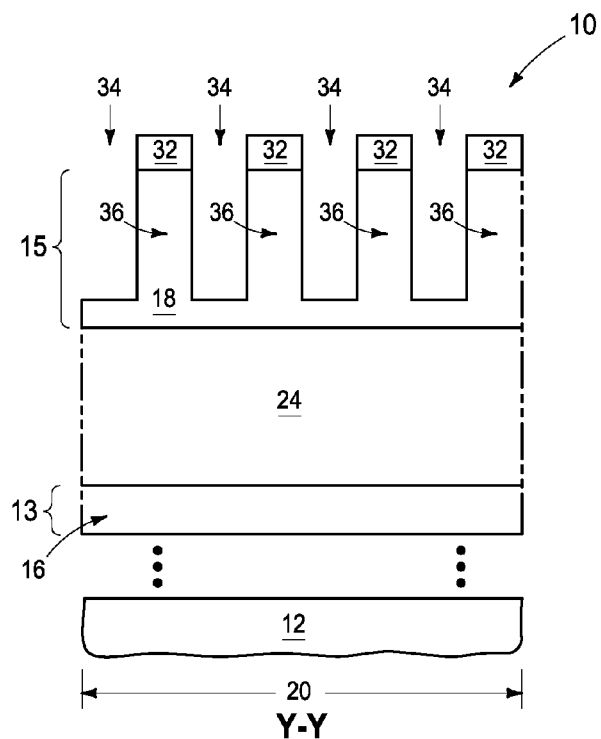

Referring to FIGS. 13-15, the trenches 34 are extended into underlying materials with one or more suitable etches. The trenches 34 are shown to extend partially into semiconductor material 18. In other embodiments, the trenches 34 may extend entirely through the semiconductor material 18.

The crossing patterns of trenches 26 (FIGS. 7-9) and trenches 34 (FIGS. 13-15) pattern the semiconductor material 18 into a plurality of pedestals 36 (with some of such pedestals being visible in the view of FIG. 15).

The trenches 26 (FIGS. 7-9) and 34 (FIGS. 13-15) may be referred to as first and second trenches, respectively. In the shown embodiment, such first and second trenches are substantially orthogonal to one another, with the term "substantially orthogonal" meaning that the first and second trenches are orthogonal to within reasonable tolerances of fabrication and measurement. In other embodiments, the second trenches may cross the first trenches without being orthogonal to the first trenches. For instance, tilted configurations may be utilized in DRAM.

The second trenches 34 extend across the memory array region 20, and also extend into the peripheral region 22.

Figure 16:
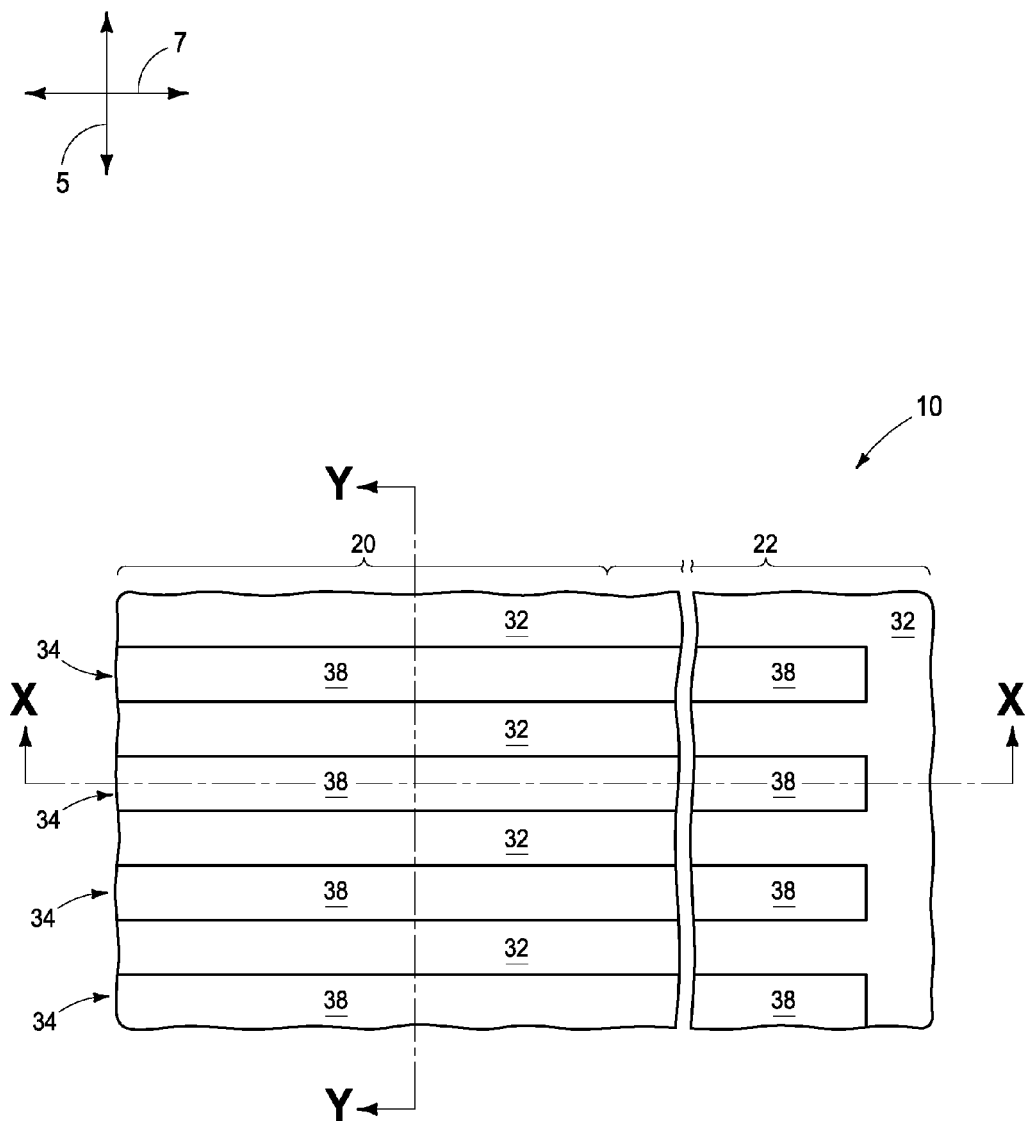
FIGS. 16-18 are a top view and cross-sectional side views of a construction at an example processing stage subsequent to that of FIGS. 13-15. The cross-sectional views of FIGS. 17 and 18 are along the lines X-X and Y-Y, respectively, of FIG. 16.
Figure 17:
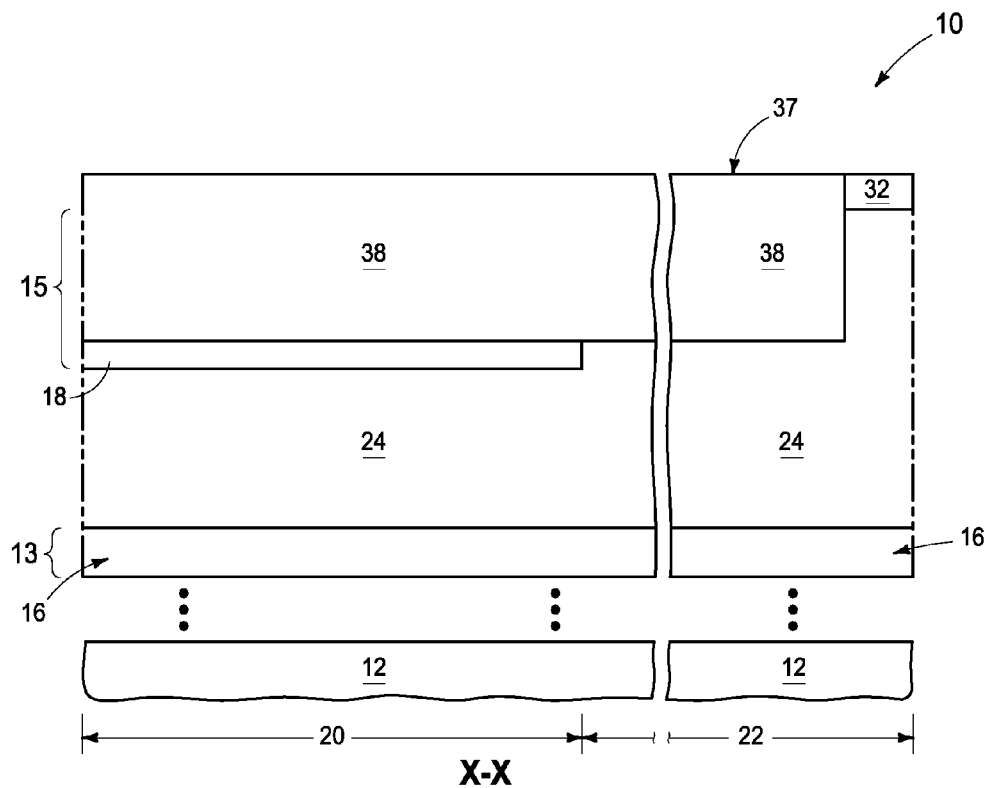
Figure 18:
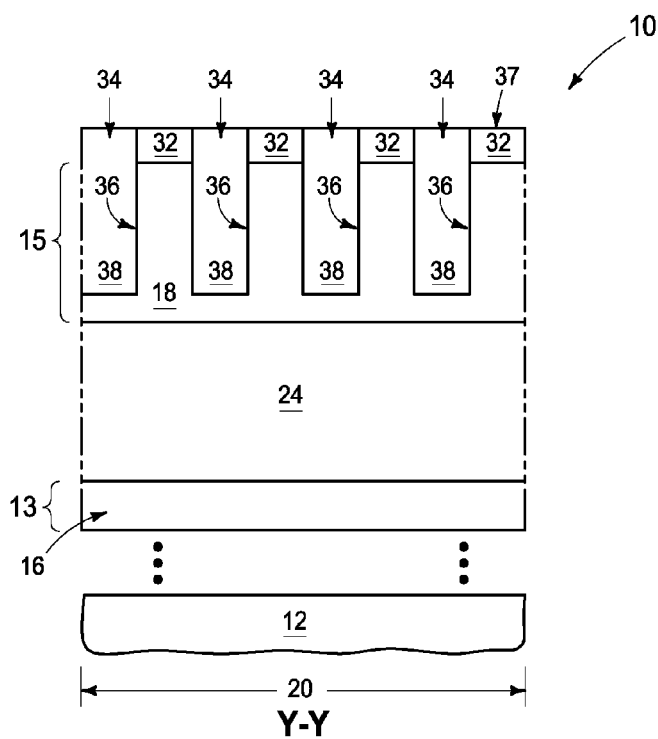

Referring to FIGS. 16-18, insulative material 38 is formed within trenches 34 and subsequently construction 10 is subjected to planarization to form a planarized upper surface 37 extending across materials 32 and 38. The insulative material 38 may comprise any suitable composition or combination of compositions; and in some embodiments may comprise one or both of silicon dioxide and silicon nitride. In some embodiments, material 38 may be a same composition as one or both of materials 24 and 30 (FIGS. 10-12); and in other embodiments material 38 may be a different composition than one or both of materials 24 and 30.

Figure 19:
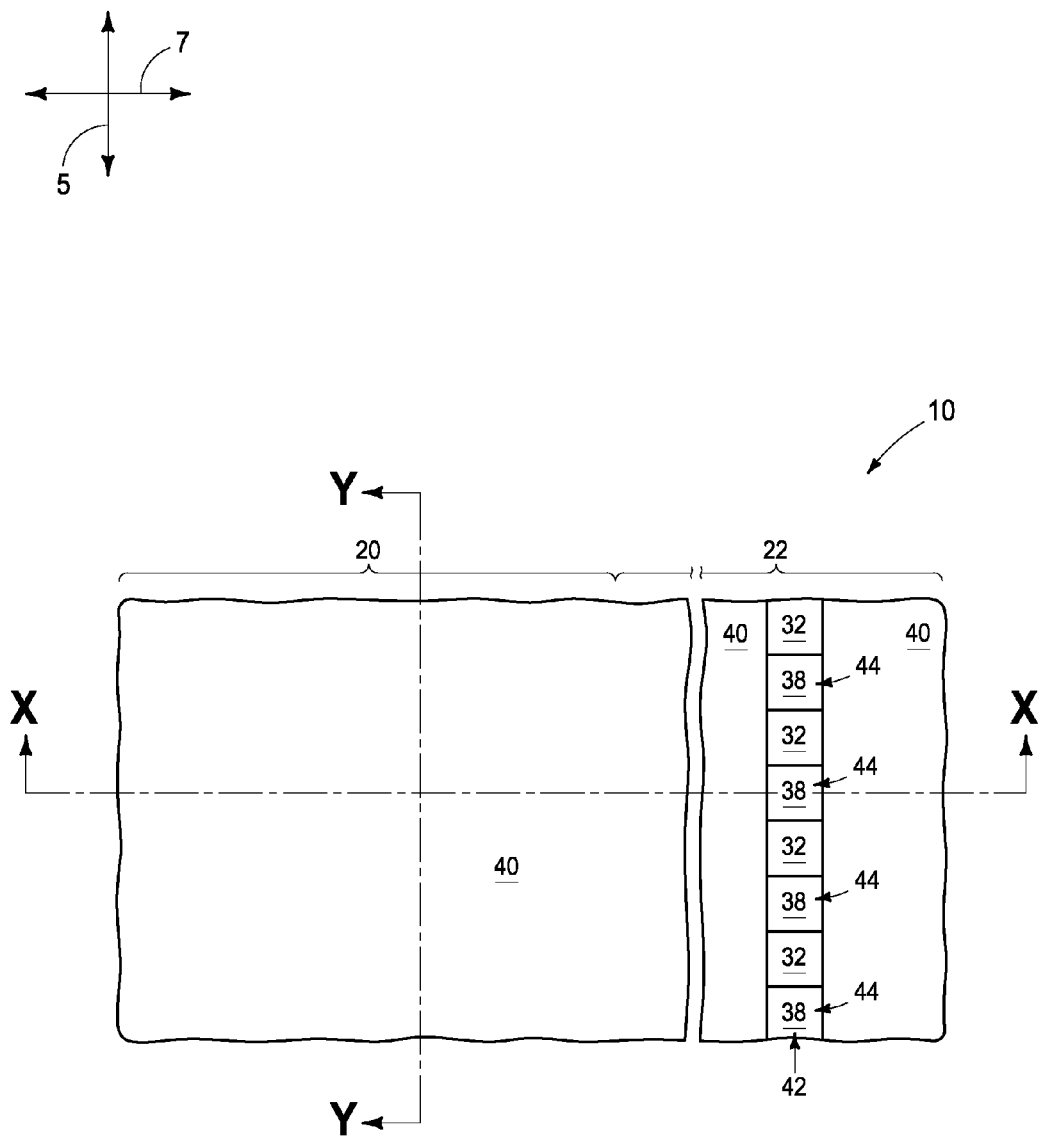
FIGS. 19-21 are a top view and cross-sectional side views of a construction at an example processing stage subsequent to that of FIGS. 16-18. The cross-sectional views of FIGS. 20 and 21 are along the lines X-X and Y-Y, respectively, of FIG. 19.
Figure 20:
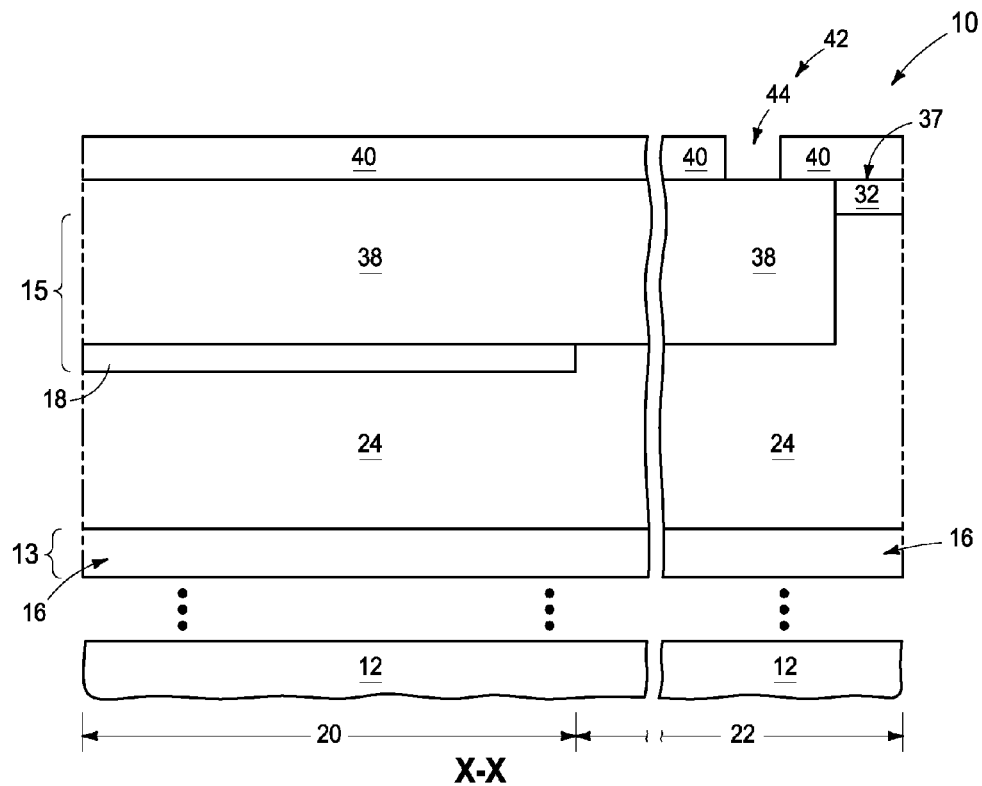
Figure 21:
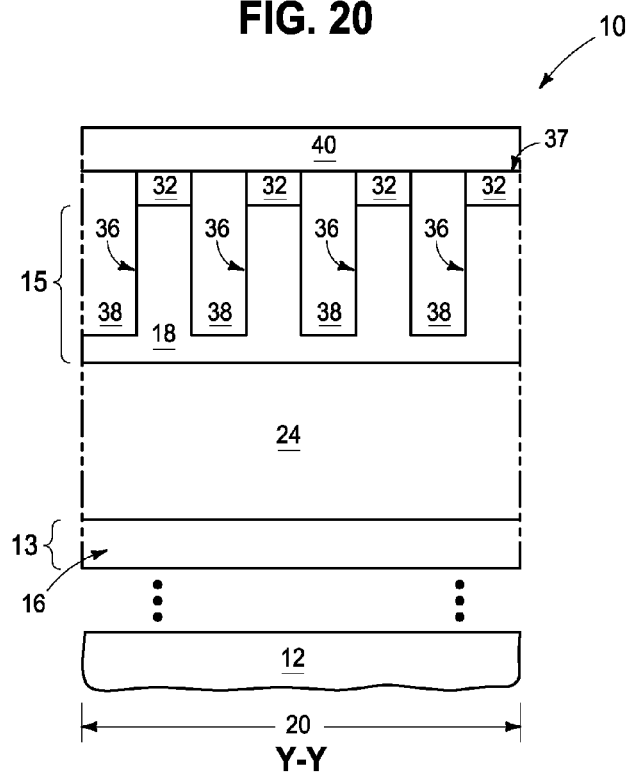

Referring to FIGS. 19-21, a patterned masking material 40 is formed over planarized upper surface 37. Masking material 40 may comprise any suitable composition or combination of compositions, and in some embodiments may comprise photolithographically-patterned photoresist. In some embodiments, masking materials 28 (FIGS. 4-6), 32 and 40 may be referred to as first, second and third masking materials, respectively; in other embodiments, masking materials 32 and 40 may be referred to as first and second masking materials, respectively; etc.

A linear opening 42 extends through patterned masking material 40. In the shown embodiment, such linear opening extends along the direction of axis 5 (or in other words, extends substantially orthogonally to trenches 34 of FIGS. 16-18). Masking material 32 and insulative material 38 are exposed within opening 42. In subsequent processing, insulative material 38 may be selectively removed relative to masking materials 32 and 40 to form contact openings. Accordingly, the masking materials 32 and 40 may be considered together to define locations of contact openings 44, with such locations being occupied by exposed material 38 at the processing stage of FIGS. 19-21.

Figure 22:
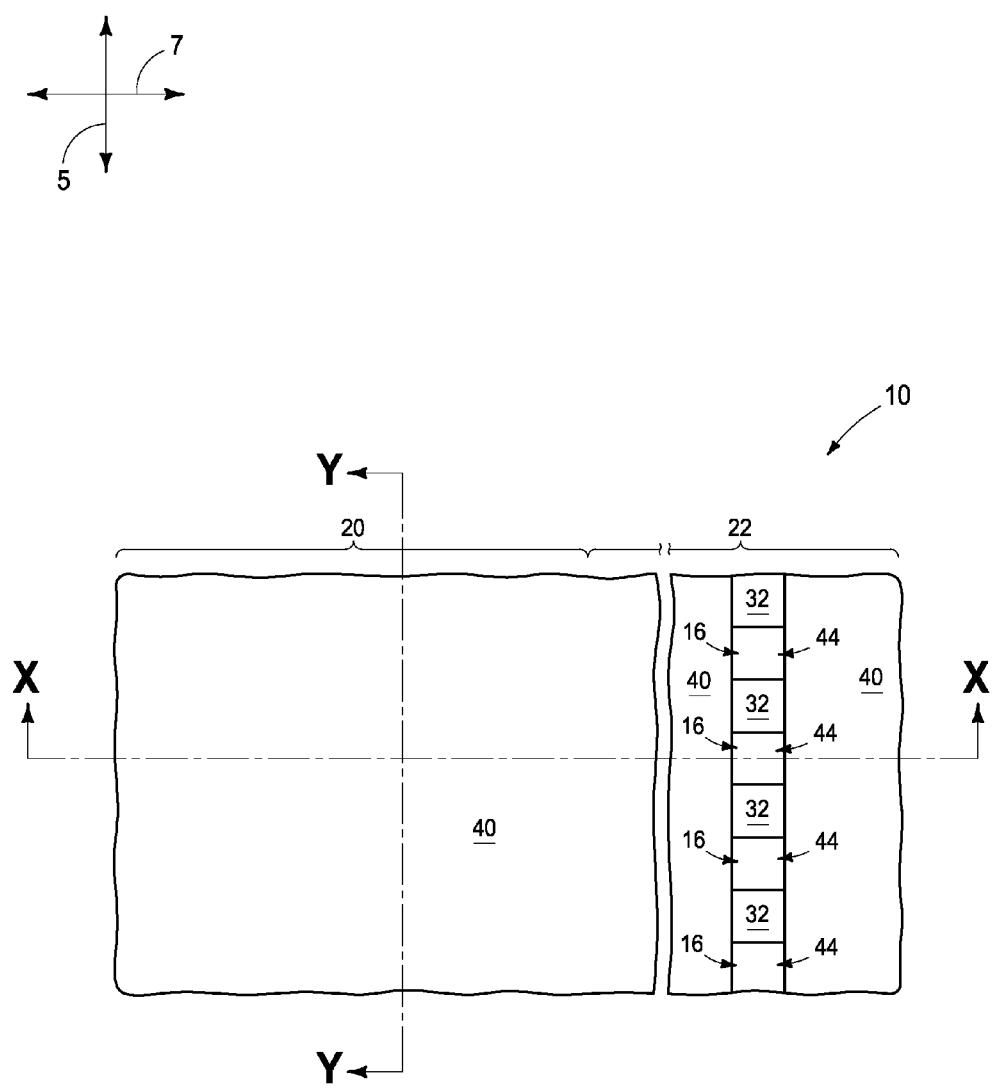
FIGS. 22-24 are a top view and cross-sectional side views of a construction at an example processing stage subsequent to that of FIGS. 19-21. The cross-sectional views of FIGS. 23 and 24 are along the lines X-X and Y-Y, respectively, of FIG. 22.
Figure 23:
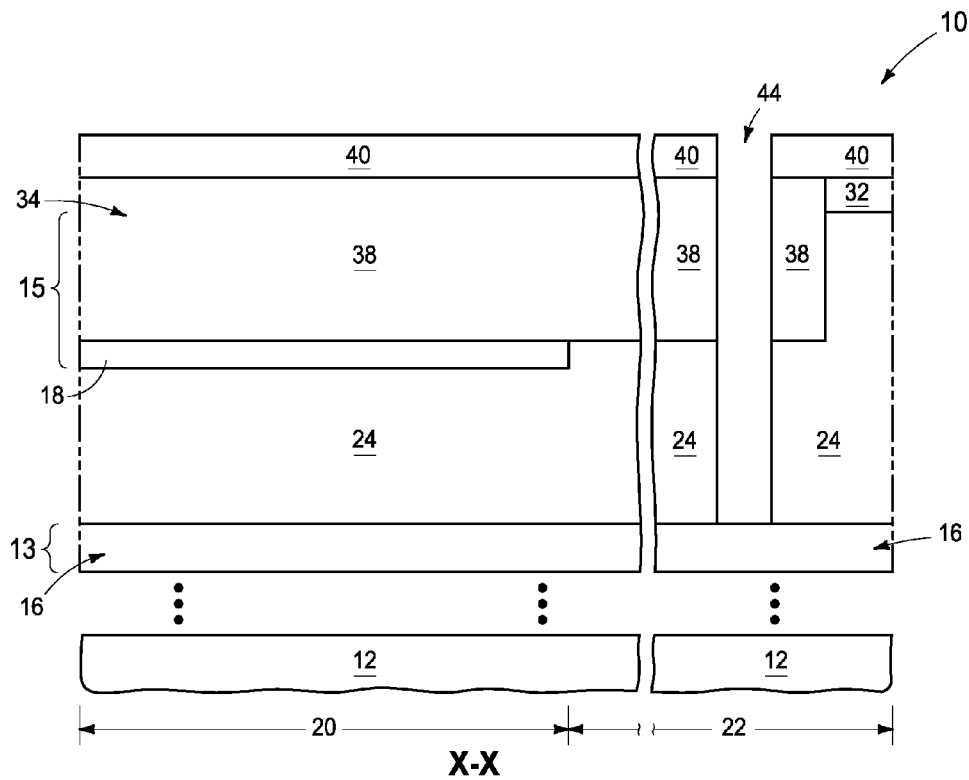
Figure 24:
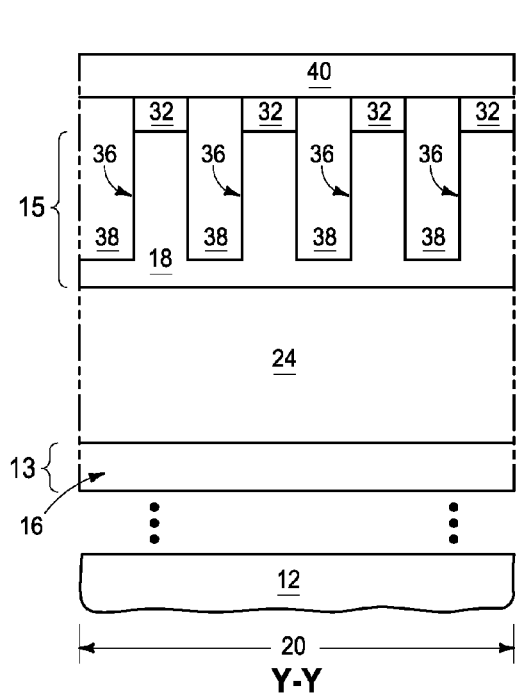

Referring to FIGS. 22-24, contact openings 44 are extended through materials 38 and 24 to the circuitry 16 of lower-level 13. FIG. 23 shows that the contact openings may be considered to extend from the second trenches 34 to the circuitry of level 13.

Figure 25:
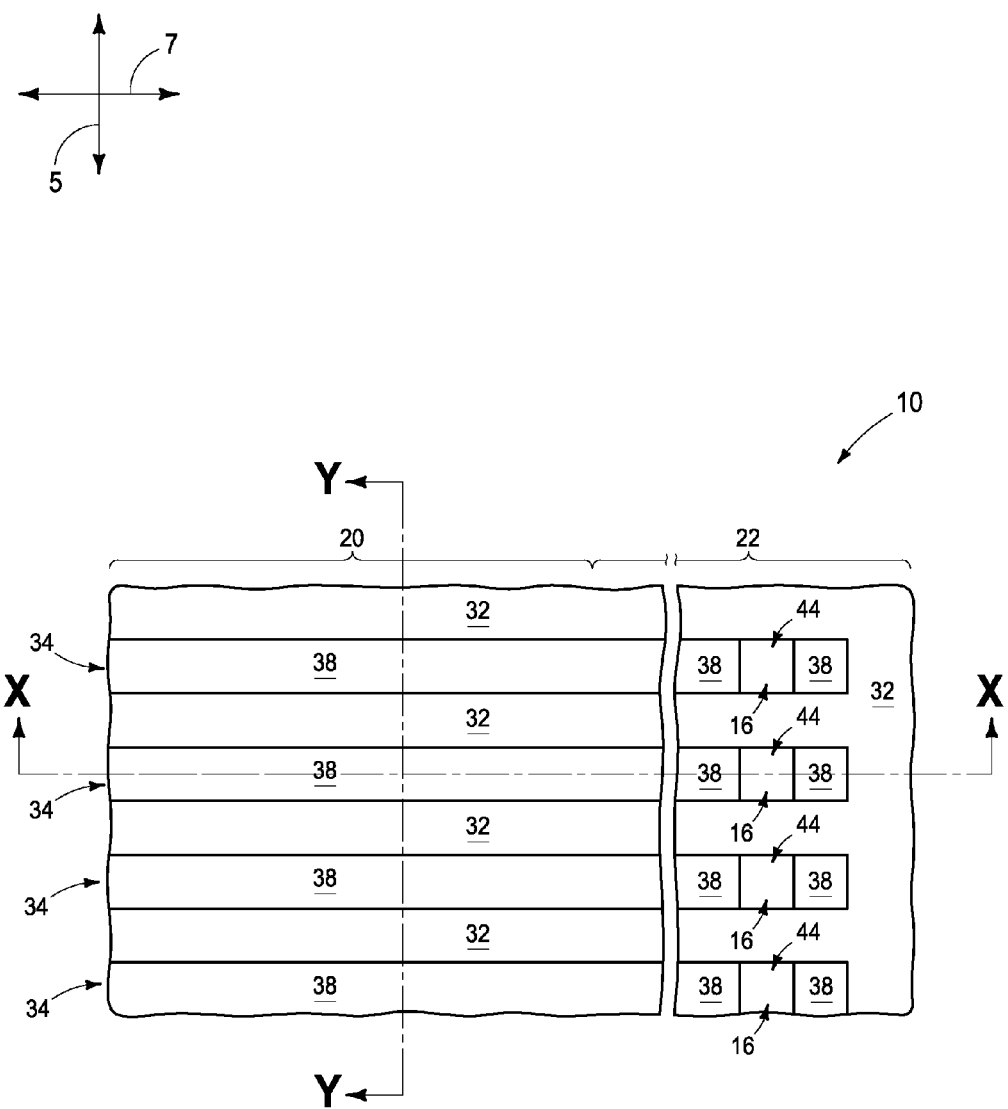
FIGS. 25-27 are a top view and cross-sectional side views of a construction at an example processing stage subsequent to that of FIGS. 22-24. The cross-sectional views of FIGS. 26 and 27 are along the lines X-X and Y-Y, respectively, of FIG. 25.
Figure 26:
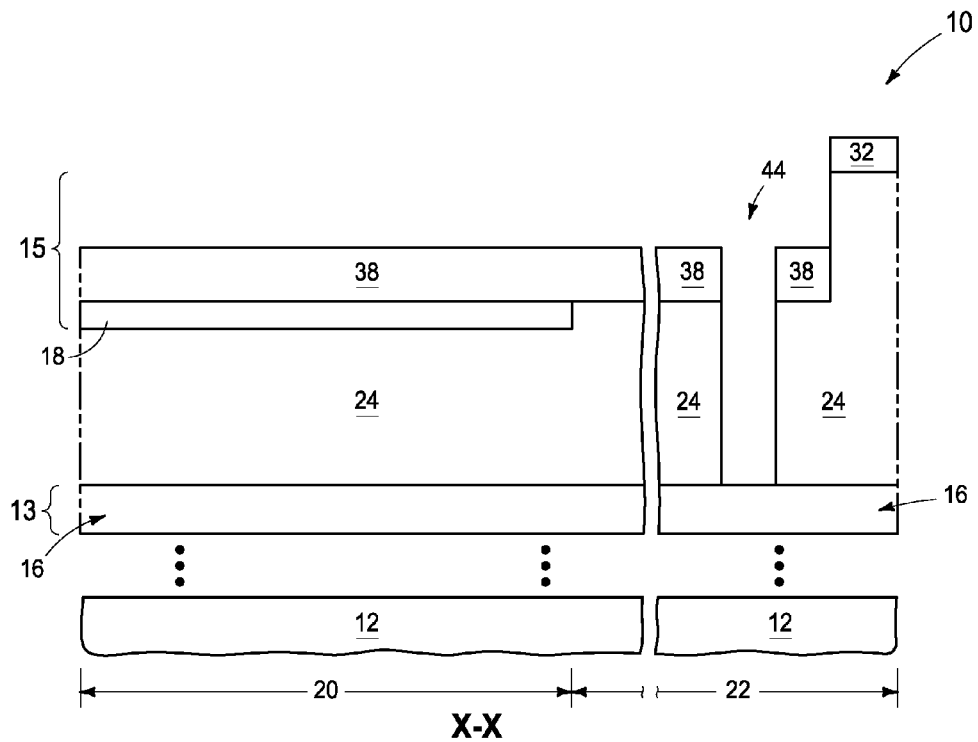
Figure 27:
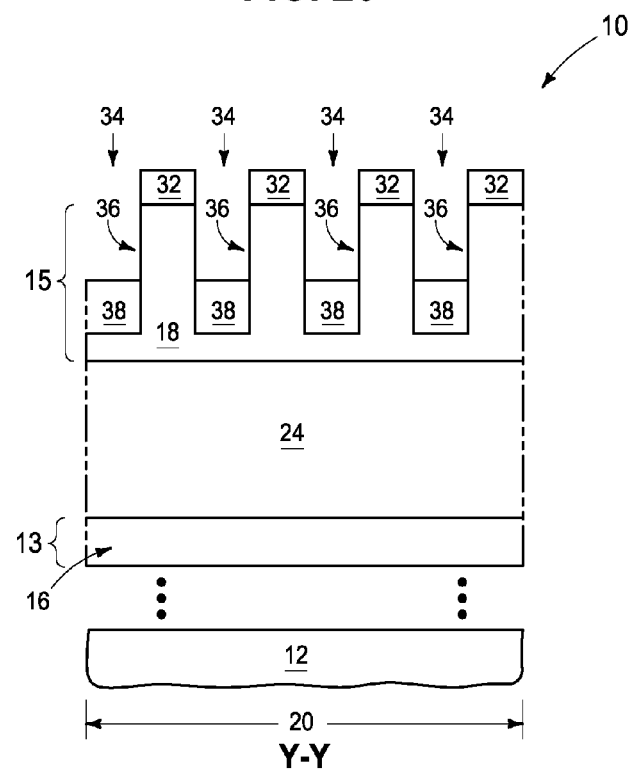

Referring to FIGS. 25-27, masking material 40 (FIGS. 22-24) is removed, and insulative material 38 is recessed within trenches 34. The recessing of material 38 may be accomplished with any suitable etch or combination of etches. In some embodiments, material 38 may be entirely removed and replaced with another insulative material instead of being recessed. In some embodiments, material 38 may be omitted. If material 38 is omitted, masking material 40 (FIGS. 22-24) may be formed to fill the trenches 34 as well as to extend over masking material 32; and subsequently an insulative material may be deposited within the trenches after removal of material 40 to form a construction analogous to that of FIGS. 25-27. Alternatively, material 38 may be omitted and a "rigid" masking material 40 may be utilized which does not extend into the trenches 34; and subsequently an insulative material may be deposited within the trenches to form a construction analogous to that of FIGS. 25-27.

Figure 28:
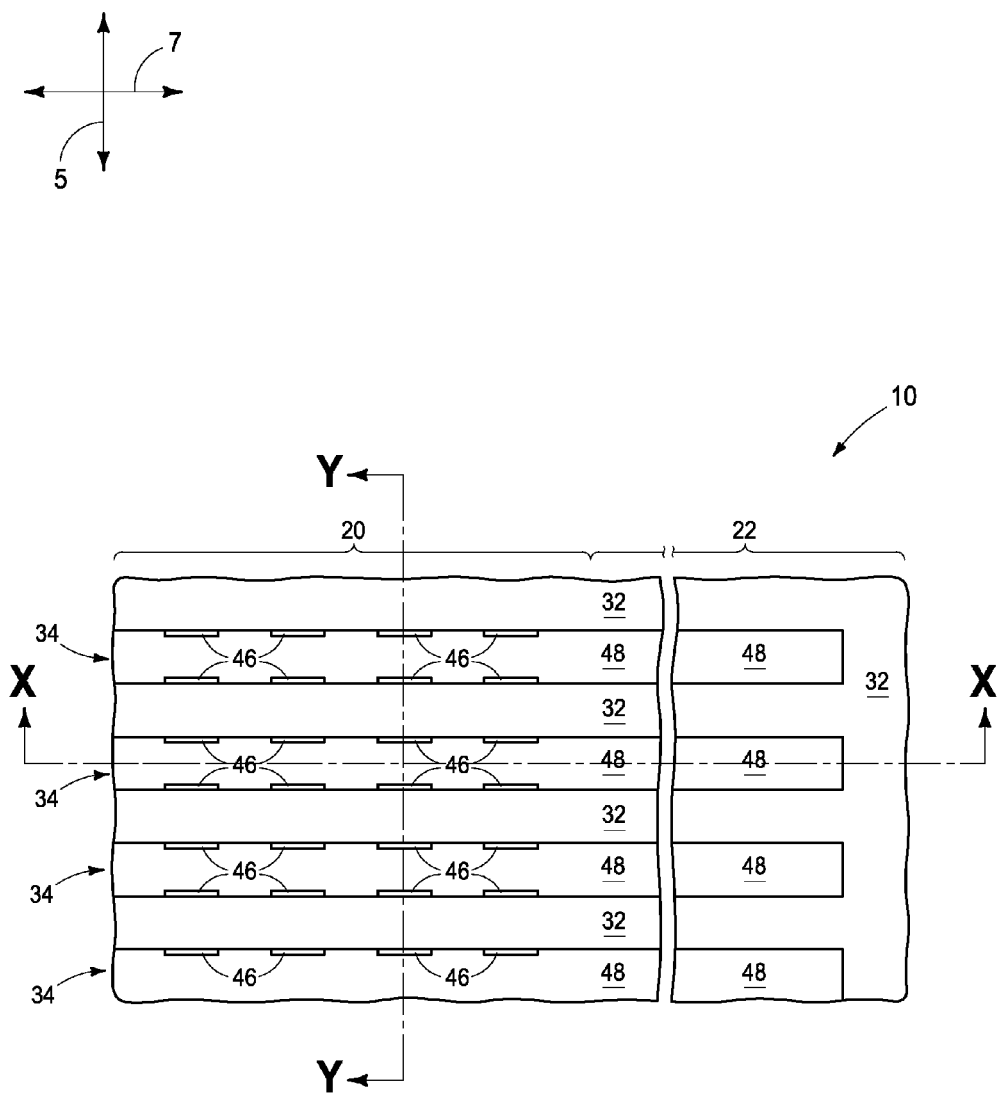
FIGS. 28-30 are a top view and cross-sectional side views of a construction at an example processing stage subsequent to that of FIGS. 25-27. The cross-sectional views of FIGS. 29 and 30 are along the lines X-X and Y-Y, respectively, of FIG. 28.
Figure 29:
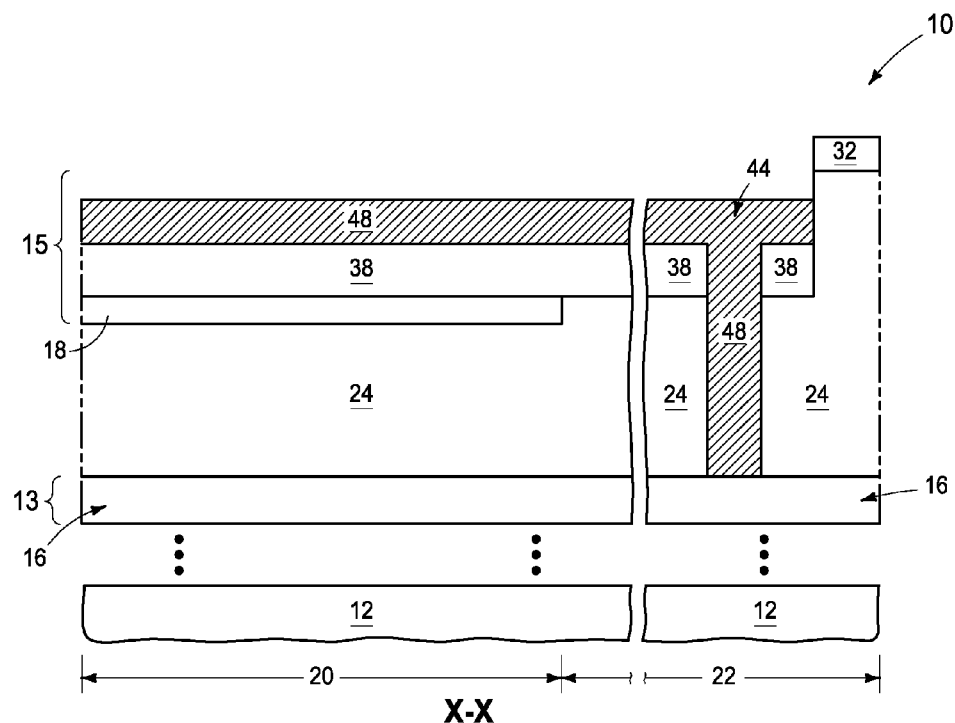
Figure 30:
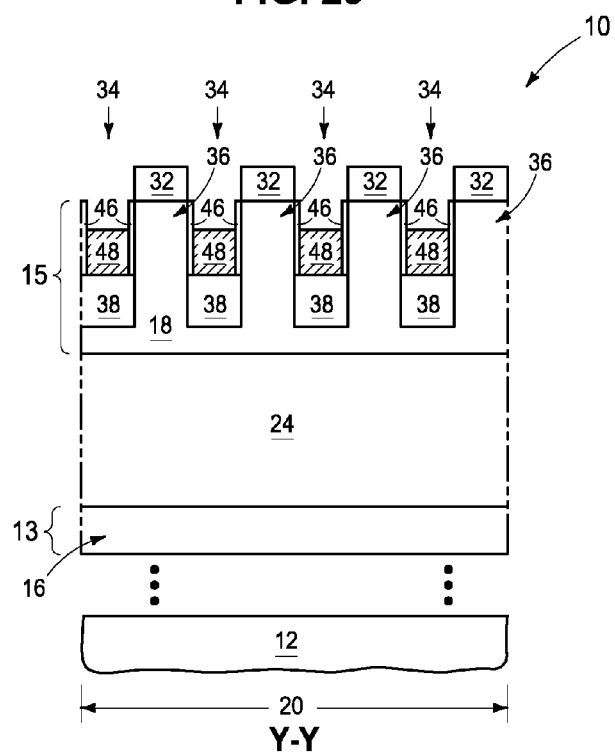

Referring to FIGS. 28-30, gate dielectric 46 is formed along sidewalls of pedestals 36. In some embodiments, material 18 comprises silicon and the gate dielectric is formed by oxidatively growing silicon dioxide along exposed surfaces of material 18. In other embodiments, the gate dielectric may be deposited and accordingly may be formed along sidewalls of masking material 32, as well as along sidewalls of material 18. The gate dielectric may comprise any suitable composition or combination of compositions; and in some embodiments may comprise, consist essentially of, or consist of silicon dioxide.

Conductive material 48 is formed within trenches 34 and contact openings 44. The conductive material may comprise any suitable composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). In some embodiments, the conductive material may comprise, consist essentially of, or consist of one or both of tungsten nitride and titanium nitride. The conductive material may be formed utilizing any suitable processing, including, for example, physical vapor deposition.

Figure 31:
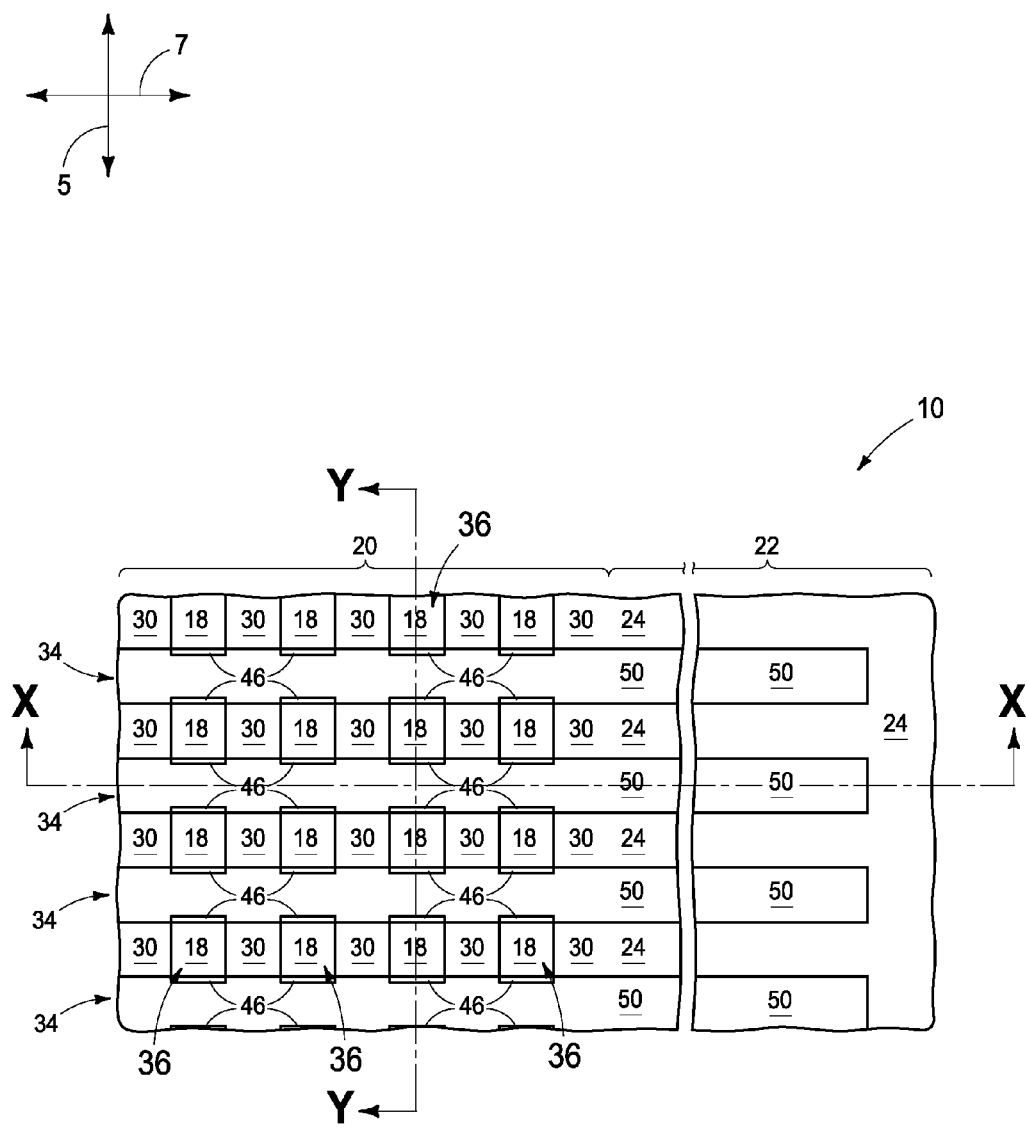
FIGS. 31-33 are a top view and cross-sectional side views of a construction at an example processing stage subsequent to that of FIGS. 28-30. The cross-sectional views of FIGS. 32 and 33 are along the lines X-X and Y-Y, respectively, of FIG. 31.
Figure 32:
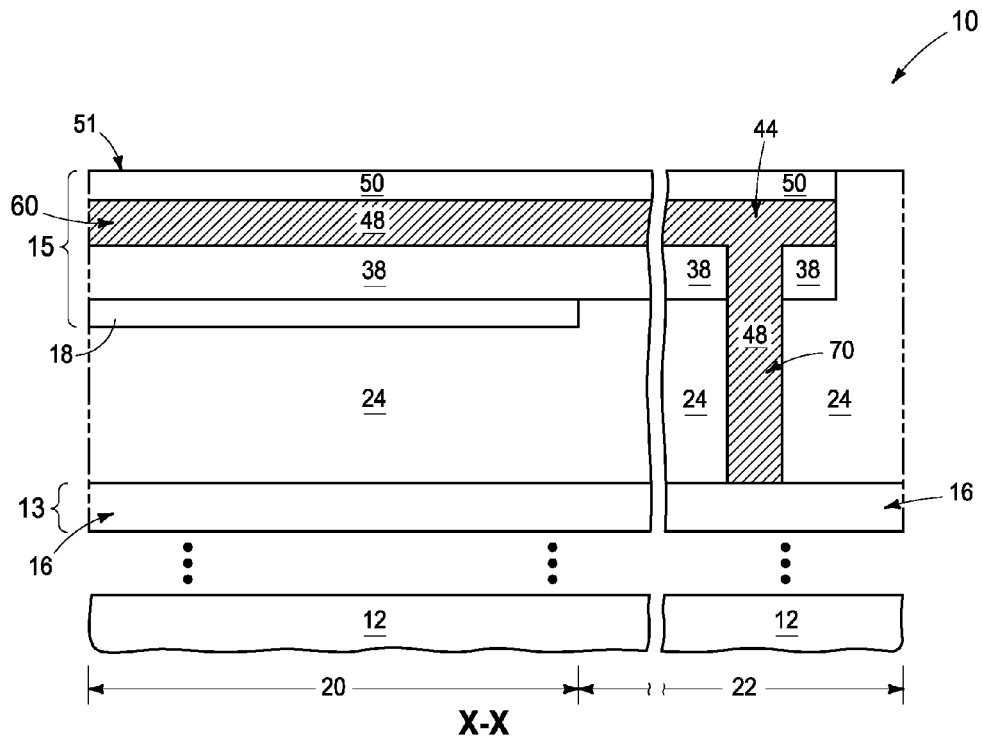
Figure 33:
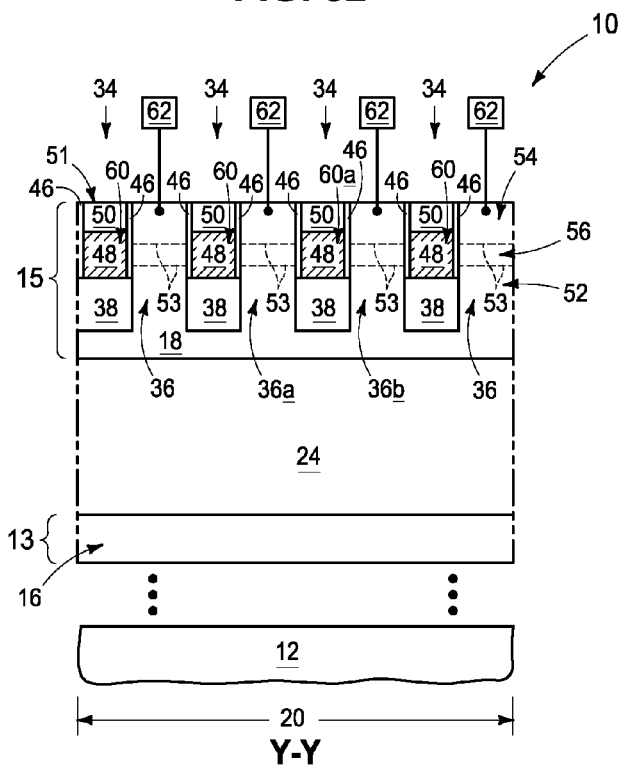

Referring to FIGS. 31-33, insulative material 50 is formed over conductive material 48 within trenches 34 and subsequently planarization is conducted to remove masking material 32 (FIGS. 28-30) and form the shown planarized upper surface 51. Material 50 may comprise any suitable material, and in some embodiments may comprise, consist essentially of, or consist of second dioxide. The material 50 may be the same as one or more of materials 24, 30 and 38 in some embodiments; and may be different than one or more of materials 24, 30 and 38 in other embodiments.

Material 18 is configured into a plurality of pedestals 36 (only some which are labeled in the top view of FIG. 31; but all of which are labeled in the cross-sectional view of FIG. 33). Dopant may be provided within the pedestals to form desired junctions. For instance, the pedestals may be incorporated into field effect transistors, bipolar transistors, thyristors, etc. In the shown embodiment, dopant is provided within the pedestals to form a pair of source/drain regions 52 and 54, which are spaced from one another by a channel region 56 (the regions 52, 54 and 56 are labeled relative to one of the pedestals 36 along the cross-sectional view of FIG. 33). Dashed lines 53 are provided within the cross-sectional view of FIG. 33 to diagrammatically illustrate approximate boundaries (i.e., junctions) between the source/drain and channel regions. Suitable dopant may be provided within the source/drain and channel regions at any suitable processing stage or stages. For instance, at least some of the dopant of the source/drain and/or channel regions may be present within material 18 at the processing stage of FIGS. 1-3; and/or at least some of the dopant may be provided at a subsequent processing stage through an appropriate dopant implant.

The conductive material 48 within trenches 34 may form sense/access lines 60 (for instance, wordlines) extending through the array of pedestals 18. The source/drain regions 52 and 54 within the pedestals may be gatedly connected to one another through operation of transistor gate regions along such sense/access lines. The pedestals may be incorporated into a memory array with any suitable processing. Such memory array may be a DRAM array, RRAM array, etc. For instance, programmable material may be provided within memory cells over the pedestals 36 and such memory cells may be addressed through operation of a first set of sense/access lines corresponding to lines 60 (for instance wordlines), and a second set of sense/access lines extending substantially orthogonally to the first set (for instance, bitlines). In some embodiments, the second set of sense/access lines may be over pedestals 36, and in other embodiments may be under pedestals 36. Data storage units 62 are diagrammatically illustrated along the cross-section of FIG. 33 as boxes joined to the top source/drain regions. Such data storage units may be each associated with a single memory cell. In some embodiments the data storage units may comprise programmable material (for instance, phase change memory, conductive bridging memory, etc.), charge storage devices (for instance, capacitors), etc. In some embodiments, the pedestals themselves may be appropriately configured to be data storage units.

The shown embodiment has the sense/access lines 60 shared by adjacent pedestals on opposing sides of the sense/access lines (for instance, the cross-section of FIG. 33 shows a pair of the pedestals labeled as 36a and 36b; and shows a sense/access line labeled as 60a shared between the pedestals 36a and 36b). Such may be suitable for some embodiments. In other embodiments, insulative material (not shown) may be utilized to split the illustrated sense/access lines down the middle. Also, although the illustrated sense/access lines only extend along one side of the channel regions within the pedestals, in other embodiments the sense/access lines may wrap at least partially around the pedestals to form gate wrap-around structures.

The conductive material 48 within interconnect openings 44 (FIG. 32) forms electrically conductive interconnects 70 which electrically couple the sense/access lines 60 with underlying circuitry 16. An advantage of the processing of FIGS. 1-33 is that the same masking material 32 (shown in FIGS. 28-30) is utilized for defining locations of the interconnects 70 and locations of the sense/access lines 60, and accordingly the interconnects may be considered to be self-aligned relative to the sense/access lines. Such may reduce risk of misalignment of the conductive interconnects relative to the sense/access lines and/or otherwise may simplify and improve fabrication as compared to conventional processes.

The masking material 40 of FIGS. 19-21 has a linear opening 42 therethrough, with such linear opening being over peripheral region 22 and extending substantially orthogonally to the trenches 34 (FIG. 16) utilized for patterning sense/access lines 60 (FIGS. 31-33). In other embodiments, masking material 40 may be formed to comprise one or more linear openings having other configurations than that of FIGS. 19-21. Examples of such other embodiments are described with reference to FIGS. 34-37.

Figure 34:
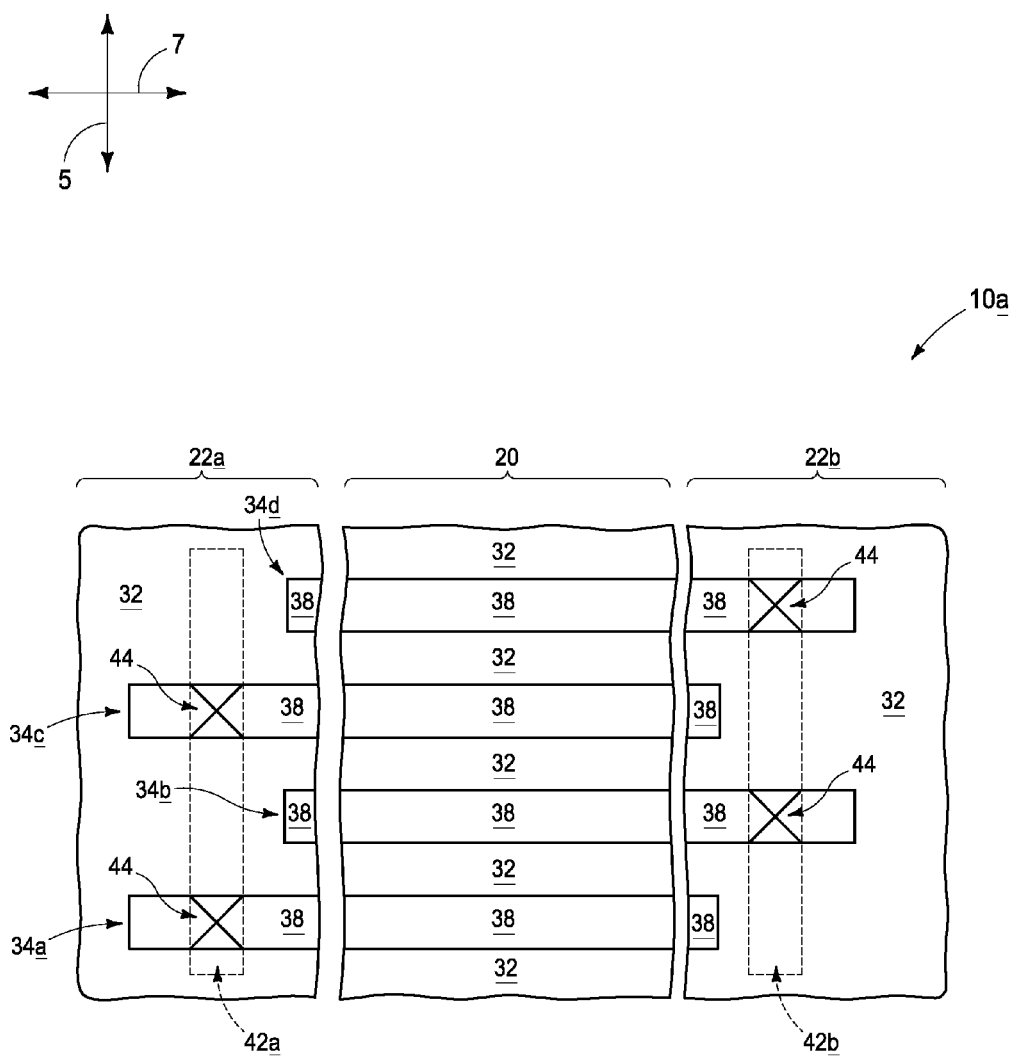
FIGS. 34-37 are top views of example embodiment constructions showing alternative masking patterns.

Referring to FIG. 34, a semiconductor construction 10a is shown at a processing stage analogous to that of FIG. 16. The construction 10a comprises a memory array region 20 between a pair of peripheral regions 22a and 22b; and comprises a plurality of second trenches 34a-34d extending across the memory region and into the peripheral regions. The peripheral regions 22a and 22b may be referred to as first and second peripheral regions, respectively.

The trenches 34a-d may be considered to subdivided amongst two sets. One of the sets includes trenches 34a and 34c and extends primarily into the first peripheral region 22a as compared to the second peripheral region 22b (i.e., larger portions of trenches 34a and 34c are within the first peripheral region 22a than are within the second peripheral region 22b). The other set includes trenches 34b and 34d which extend primarily into the second peripheral region 22b as compared to the first peripheral region 22a.

Linear openings 42a and 42b (analogous to the opening 42 of FIG. 19) are diagrammatically illustrated in FIG. 34. Such linear openings would be formed through a third mask analogous to the mast described with reference to FIGS. 19-21. However, whereas the mask of FIGS. 19-21 has a single linear opening 42 within the single illustrated peripheral region, the mask of FIG. 34 comprises two linear openings 42a and 42b, with one of the linear openings being over peripheral region 22a and the other being over peripheral region 22b.

Locations of contact openings 44 are diagrammatically illustrated in FIG. 34 as regions where linear openings 42a and 42b cross trenches 34a-d. The contact openings associated with trenches 34a and 34c are within first peripheral region 22a whereas the contact openings associated with trenches 34b and 34d are within the second peripheral region 22b.

Figure 35:
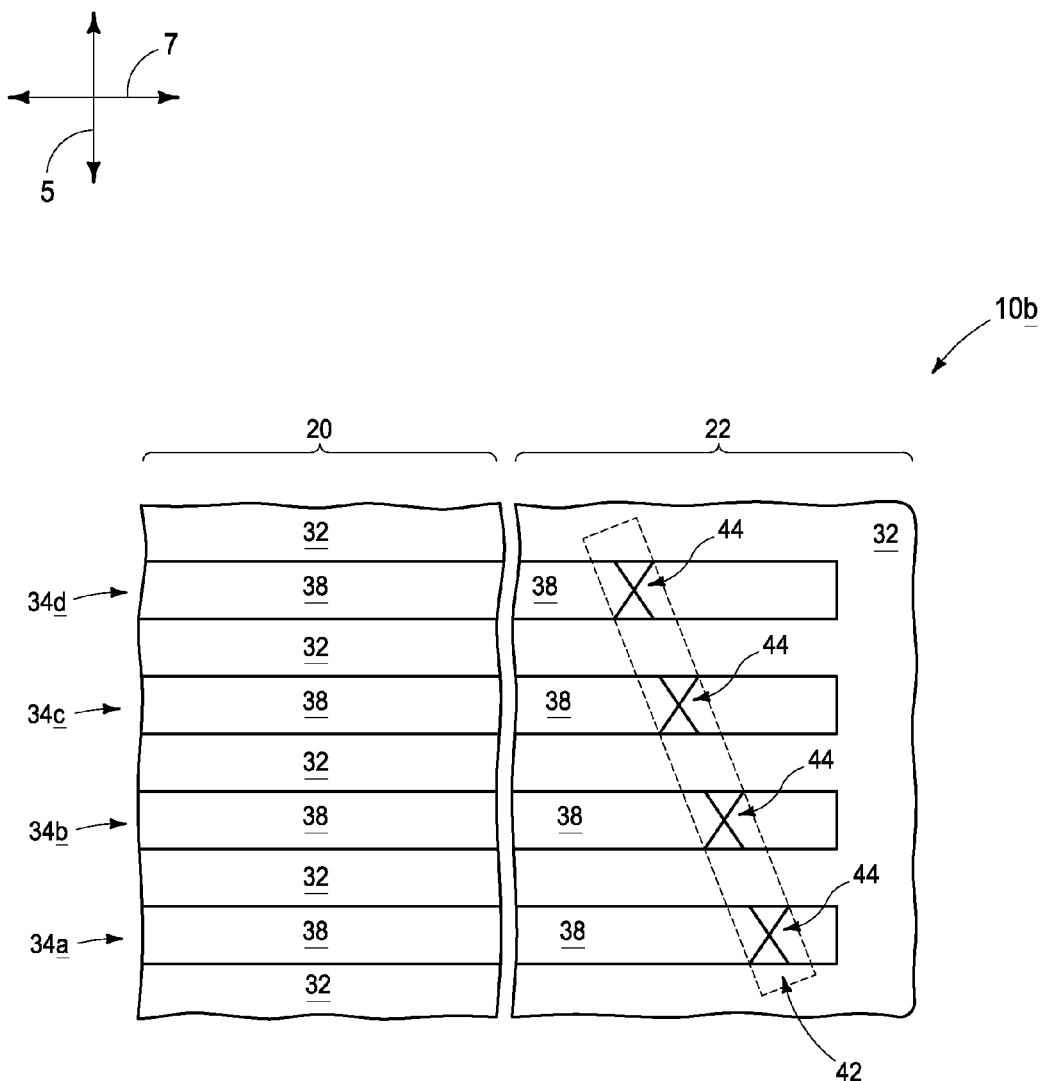

The embodiment of FIG. 34 utilizes linear openings within the third mask which extend substantially orthogonally to the trenches 34a-d. In other embodiments, the linear openings within the third mask may extend along a direction which is not orthogonal to the second trenches. For instance, FIG. 35 shows a construction 10b at a processing stage analogous to that of FIG. 34, but having a linear opening extending diagonally to the trenches. The construction 10b is shown having the trenches 34a-d extending into only one peripheral region 22 rather than two peripheral regions. The trenches extend along the direction of axis 7. The linear opening 42 extends along a direction which is not orthogonal to axis 7, but which crosses the second trenches 34a-d.

Figure 36:
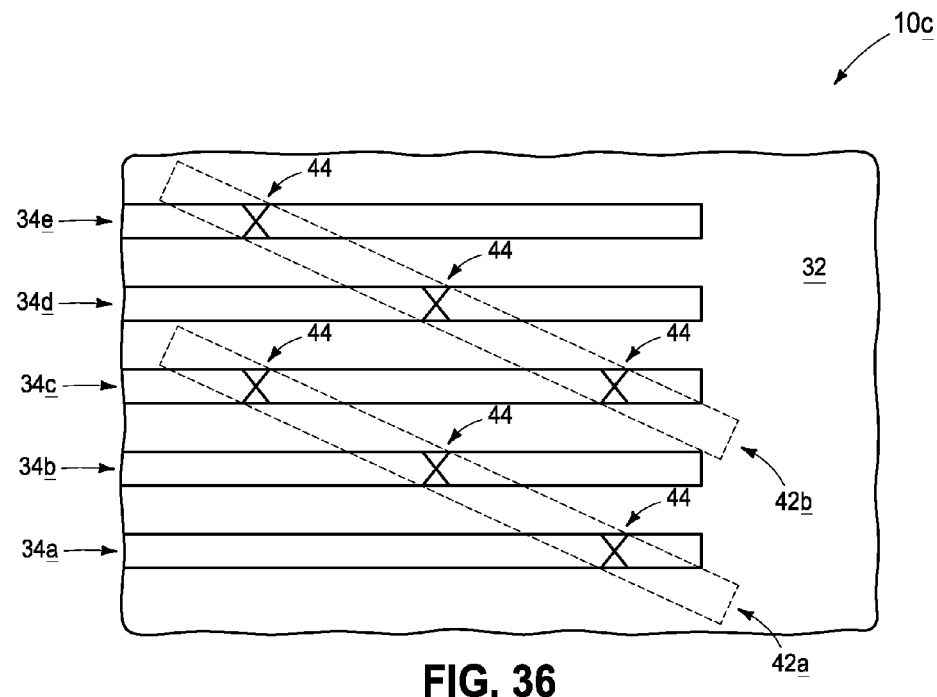

Although only a single linear opening 42 is illustrated in FIG. 35, in other embodiments there may be multiple linear openings extending along a direction non-orthogonal relative to the second trenches. For instance, FIG. 36 shows a construction 10c at a processing stage analogous to that of FIG. 35 and comprising two linear openings 42a and 42b within the third mask. A problem that can occur in utilizing multiple linear openings that extend along an angle other than orthogonal to the second trenches is that a single trench may end up with more than one contact opening. For instance, FIG. 36 shows five trenches 34a-e; and the middle trench 34c has two contact openings 44. Such may lead to the sense/access line formed within trench 34c having two electrical contacts to a lower circuit level. In some embodiments, it may be desired to utilize the two electrical contacts to have redundancy, but in other embodiments the two electrical contacts problematically create two circuit paths to a sense/access line when only a single circuit path is desired.

Figure 37:
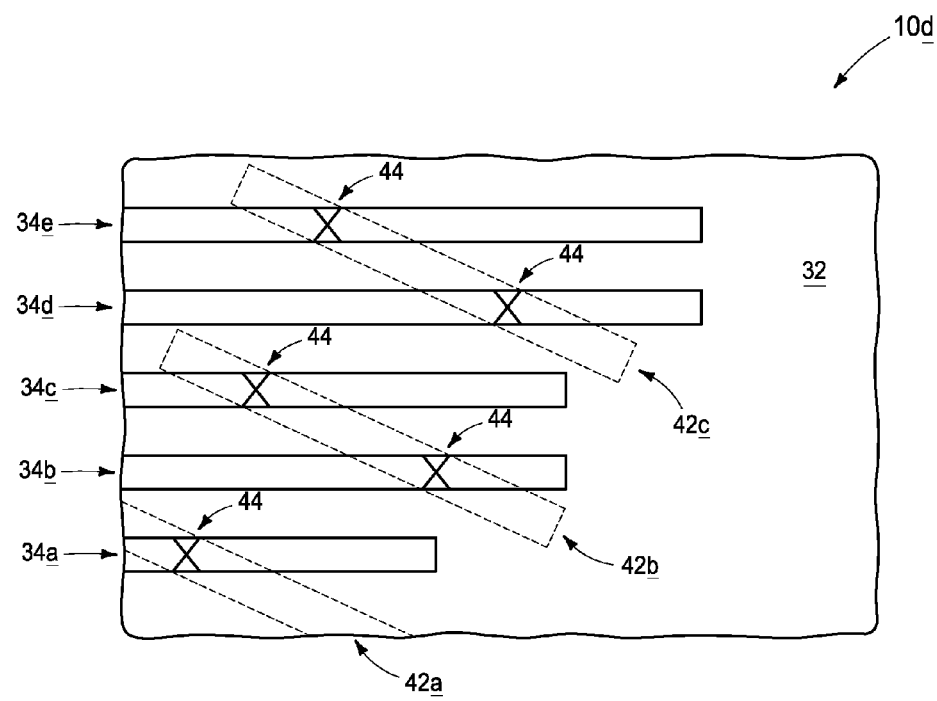

The problem of FIG. 36 may be eliminated by utilizing shorter linear openings than those shown in FIG. 36, or by staggering the sizes of the trenches 34a-e. For instance, FIG. 37 shows a construction 10d at a processing stage analogous that of FIG. 36, but in which some of the second trenches 34a-e are shorter than others to avoid having any of the trenches joining with more than one of the shown linear openings 42a-c. Such eliminates the potential problem of having more than one contact opening 44 formed along any of the sense/access lines created within trenches 34a-e.

The structures and devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming a memory array. An assembly is formed to comprise an upper level over a lower level. The lower level comprises circuitry. The upper level comprises semiconductor material within a memory array region and comprises insulative material laterally outward of the semiconductor material in a region peripheral to the memory array region. First trenches are formed to extend into the semiconductor material, and second trenches are formed to extend into the semiconductor material. The first and second trenches pattern a plurality of pedestals from the semiconductor material, and the second trenches extend into the peripheral region. Contact openings are formed within the peripheral region to extend downwardly from the second trenches to the first level of circuitry. Conductive material is formed within the second trenches and within the contact openings. The conductive material forms sense/access lines within the second trenches and forms electrical contacts within the contact openings to electrically couple the sense/access lines to the lower level of circuitry.

Some embodiments include a method of forming a memory array. An assembly is formed to comprise an upper level over a lower level. The lower level comprises circuitry.

The upper level comprises semiconductor material within a memory array region, and comprises a region peripheral to the memory array region. First trenches are formed to extend into the semiconductor material of the upper level. The first trenches are filled with insulative material. A surface across the insulative material and the semiconductor material is planarized. A first patterned masking material is formed over the planarized surface to define locations of second trenches. The second trenches are formed within the defined locations. The first and second trenches pattern a plurality of pedestals from the semiconductor material, and the second trenches extend into the peripheral region. A second patterned masking material is formed over the first patterned masking material. The first and second patterned masking materials together define locations of contact openings within the peripheral region. The contact openings are formed to extend downwardly from the second trenches to the first level of circuitry. Conductive material is formed within the second trenches and within the contact openings. The conductive material forms sense/access lines within the second trenches and forms electrical contacts within the contact openings to electrically couple the sense/access lines to the lower level of circuitry.

Some embodiments include a method of forming a memory array. An assembly is formed to comprise an upper level over a lower level. The lower level comprises circuitry. The upper level comprises semiconductor material within a memory array region and comprises insulative material laterally outward of the semiconductor material in a region peripheral to the memory array region. A first patterned mask is formed over the semiconductor material and defines locations of first trenches. The first trenches are formed to extend into the semiconductor material and along a first direction. The first trenches are filled with insulative material, and a surface across the insulative material and the semiconductor material is planarized. A second patterned mask is formed over the planarized surface, and defines locations of second trenches. The second trenches are formed to extend into the semiconductor material and along a second direction substantially orthogonal to the first direction. The first and second trenches pattern a plurality of pedestals from the semiconductor material. The second trenches extend into the peripheral region. A third patterned mask is formed over the second patterned mask. The third patterned mask and second patterned mask together define contact locations at bottoms of the second trenches within the peripheral region. The contact locations are etched to form contact openings that extend downwardly from the second trenches to the circuitry of the lower level. Conductive material is formed within the second trenches and within the contact openings. The conductive material forms sense/access lines within the second trenches and forms electrical contacts within the contact openings to electrically couple the sense/access lines with the circuitry of the lower level.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a memory array, comprising:
    forming an assembly comprising an upper level over a lower level; the lower level comprising circuitry; the upper level comprising semiconductor material within a memory array region and comprising insulative material laterally outward of the semiconductor material in a region peripheral to the memory array region;
    forming first trenches extending into the semiconductor material;
    forming second trenches extending into the semiconductor material; the first and second trenches patterning a plurality of pedestals from the semiconductor material; the second trenches extending into the peripheral region;
    forming contact openings within the peripheral region and extending downwardly from the second trenches to the first level of circuitry; and
    forming conductive material within the second trenches and within the contact openings; the conductive material forming sense/access lines within the second trenches and forming electrical contacts within the contact openings to electrically couple the sense/access lines to the lower level of circuitry.

2. The method of claim 1 wherein locations of the second trenches are defined with one mask, and wherein locations of the contact openings are defined with said one mask in combination with another mask.

3. The method of claim 1 further comprising forming insulative material along bottoms of the second trenches prior to forming the contact openings.

4. The method of claim 1 further comprising providing doped regions within said pedestals.

5. The method of claim 1 wherein the circuitry is decoding circuitry.

6. The method of claim 1 wherein the circuitry is CMOS decoding circuitry.

7. The method of claim 1 wherein the semiconductor material comprises silicon.

8. The method of claim 1 wherein the conductive material comprises metal.

9. The method of claim 1 wherein the conductive material comprises one or both of tungsten nitride and titanium nitride.

10. A method of forming a memory array, comprising:
    forming an assembly comprising an upper level over a lower level; the lower level comprising circuitry; the upper level comprising semiconductor material within a memory array region, and comprising a region peripheral to the memory array region;
    forming first trenches extending into the semiconductor material of the upper level;
    filling the first trenches with insulative material;
    planarizing a surface across the insulative material and the semiconductor material;
    forming a first patterned masking material over the planarized surface to define locations of second trenches;
    forming the second trenches within the defined locations; the first and second trenches patterning a plurality of pedestals from the semiconductor material; the second trenches extending into the peripheral region;
    forming a second patterned masking material over the first patterned masking material; the first and second patterned masking materials together defining locations of contact openings within the peripheral region;
    forming the contact openings to extend downwardly from the second trenches to the first level of circuitry; and
    forming conductive material within the second trenches and within the contact openings; the conductive material forming sense/access lines within the second trenches and forming electrical contacts within the contact openings to electrically couple the sense/access lines to the lower level of circuitry.

11. The method of claim 10 wherein the second masking material has a linear opening therein, with such linear opening extending substantially orthogonally to the second trenches.

12. The method of claim 10 wherein the memory array region is between a pair of peripheral regions, with the peripheral regions being a first peripheral region and a second peripheral region; and wherein the second masking material has a pair of linear openings therein, with such linear openings extending substantially orthogonally to the second trenches, with one of the linear openings being over the first peripheral region and the other of the linear openings being over the second peripheral region.

13. The method of claim 12 wherein some of the second trenches extend primarily into the first peripheral region as compared to the second peripheral region, and others of the second trenches extend primarily into the second peripheral region as compared to the first peripheral region.

14. The method of claim 10 wherein the second masking material has at least one linear opening therein which extends along a direction that crosses the second trenches and that is not orthogonal to the second trenches.

15. The method of claim 14 wherein there are multiple of the linear openings; and wherein some of the second trenches are shorter than others to avoid having any of the trenches joining with more than one of the linear openings.

16. A method of forming a memory array, comprising:
    forming an assembly comprising an upper level over a lower level; the lower level comprising circuitry; the upper level comprising semiconductor material within a memory array region and comprising insulative material laterally outward of the semiconductor material in a region peripheral to the memory array region;
    forming a first patterned mask over the semiconductor material; the first patterned mask defining locations of first trenches;
    forming the first trenches to extend into the semiconductor material and along a first direction;
    filling the first trenches with insulative material and planarizing a surface across the insulative material and the semiconductor material;
    forming a second patterned mask over the planarized surface; the second patterned mask defining locations of second trenches;
    forming the second trenches to extend into the semiconductor material and along a second direction substantially orthogonal to the first direction; the first and second trenches patterning a plurality of pedestals from the semiconductor material; the second trenches extending into the peripheral region;
    forming a third patterned mask over the second patterned mask; the third patterned mask and second patterned mask together defining contact locations at bottoms of the second trenches within the peripheral region;
    etching into the contact locations to form contact openings extending downwardly from the second trenches and to the circuitry of the lower level; and
    forming conductive material within the second trenches and within the contact openings; the conductive material forming sense/access lines within the second trenches and forming electrical contacts within the contact openings to electrically couple the sense/access lines with the circuitry of the lower level.

17. The method of claim 16 wherein the insulative material is first insulative material, and further comprising forming second insulative material along bottoms of the second trenches prior to forming the contact openings.

18. The method of claim 16 further comprising providing doped regions within said pedestals.

19. The method of claim 16 wherein the circuitry is decoding circuitry.

20. The method of claim 16 wherein the circuitry is CMOS decoding circuitry.

21. The method of claim 16 wherein the semiconductor material comprises silicon.

22. The method of claim 16 wherein the conductive material comprises metal.

23. The method of claim 16 wherein the third patterned mask has a linear opening therein, with such linear opening extending substantially orthogonally to the second trenches.

24. The method of claim 16 wherein the memory array region is between a pair of peripheral regions, with the peripheral regions being a first peripheral region and a second peripheral region; and wherein the third patterned mask has a pair of linear openings therein, with such linear openings extending substantially orthogonally to the second trenches, with one of the linear openings being over the first peripheral region and the other of the linear openings being over the second peripheral region.

25. The method of claim 24 wherein some of the second trenches extend primarily into the first peripheral region as compared to the second peripheral region, and others of the second trenches extend primarily into the second peripheral region as compared to the first peripheral region.

26. The method of claim 16 wherein the third patterned mask has at least one linear opening therein which extends along a direction that crosses the second trenches and that is not orthogonal to the second trenches.

\* \* \* \* \*